(12) United States Patent
Huang et al.

(10) Patent No.: US 7,786,759 B2
(45) Date of Patent: Aug. 31, 2010

(54) BIDIRECTIONAL SIGNAL INTERFACE AND RELATED SYSTEM AND METHOD

(75) Inventors: Lei Huang, Beijing (CN); Danyang Zhu, Beijing (CN); Myron Miske, Rockingham, NH (US)

(73) Assignee: Fairchild Semiconductor Corporation, South Portland, ME (US)

( * ) Notice: Subject to any disclaimer, the term of this patent is extended or adjusted under 35 U.S.C. 154(b) by 197 days.

(21) Appl. No.: 11/800,384

(22) Filed: May 4, 2007

(65) Prior Publication Data

US 2008/0150581 A1 Jun. 26, 2008

Related U.S. Application Data

(60) Provisional application No. 60/876,592, filed on Dec. 22, 2006.

(51) Int. Cl.
*H03K 19/094* (2006.01)
(52) U.S. Cl. .......................... 326/68; 326/82
(58) Field of Classification Search ............ 326/62–74, 326/80–83, 86, 87
See application file for complete search history.

(56) References Cited

U.S. PATENT DOCUMENTS 5,877,633 A * 3/1999 Ng et al. ................ 326/80

6,307,397 B1 * 10/2001 Mueller et al. ............. 326/81
6,359,471 B1 * 3/2002 Mueller et al. ............. 326/81
6,724,224 B1 4/2004 Li
6,781,415 B2 8/2004 Clark et al.
7,397,273 B1 * 7/2008 Ng et al. .................... 326/38

OTHER PUBLICATIONS

Texas Instruments, "4-Bit Bidirectional Voltage-Level Translator with Auto Direction Sensing and +–15-kV EDS Protection, TXB0104", SCES650B-Apr. 2006-Revised Oct. 2006.
Texas Instruments, "4-Bit Bidirectional Voltage-Level Trannslator for Open-Drain Applications", SCES651B-Jun. 2006-Revised Feb. 2007.

* cited by examiner

*Primary Examiner*—Don P Le
(74) *Attorney, Agent, or Firm*—Bryan A. Santarelli; Graybeal Jackson LLP

(57) ABSTRACT

An embodiment of a bidirectional signal interface includes first and second nodes and first and second translating circuits. The first and second nodes are respectively operable to receive a first logic signal and a second logic signal. The first translating circuit has a first signal path coupled between the first and second nodes, is operable to sense a transition of the first logic signal on the first node, and, in response to the transition, is operable to couple the first logic signal to the second node via the first signal path. The second translating circuit has a second signal path that is coupled between the first and second nodes and that is parallel to the first signal path, is operable to sense a transition of the second logic signal on the second node, and is, in response to the transition of the second logic signal, operable to couple the second logic signal to the first node via the second signal path.

54 Claims, 11 Drawing Sheets

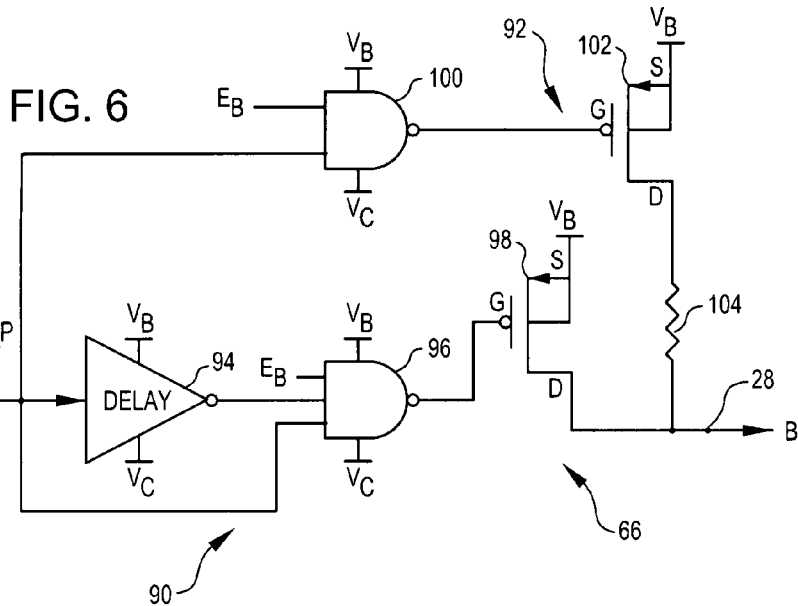

US 7,786,759 B2

BIDIRECTIONAL SIGNAL INTERFACE AND RELATED SYSTEM AND METHOD

CLAIM OF PRIORITY

This application claims priority to U.S. Provisional Application Ser. No. 60/876,592, filed on Dec. 22, 2006, which is incorporated by reference.

BACKGROUND

A bidirectional signal interface allows communication between two or more circuits that generate logic signals having different voltage levels. For example, suppose that a processor generates a low logic level (e.g., a logic 0 level) equal to 0 Volts (V) and a high logic level (e.g., a logic 1 level) equal to 1.8 V, and a memory generates a logic 0 level equal to 0 V and a logic 1 level equal to 2.7 V. Because their logic 1 levels are different, one typically cannot connect the signal (e.g., data address) nodes of the processor directly to the corresponding signal nodes of the memory. Instead, one places a bidirectional signal interface between the processor and memory, and the interface translates the voltage level of the logic-1 signals from the processor to the logic-1 voltage level of the memory, and translates the voltage level of the logic-1 signals from the memory to the logic-1 voltage level of the processor.

Many known bidirectional signal interfaces require one or more direction signals that indicate which coupled circuit (e.g., the processor or the memory in the above example) is driving a signal onto a particular signal node at a particular time. For example, when the processor drives a logic signal onto a signal node, the processor may generate a direction signal that indicates to the interface that the processor is the source of the signal. Likewise, when the memory drives a logic signal onto the same signal node, the memory may generate a direction signal that indicates to the interface that memory is the source of the signal.

But some circuits are unable to generate a direction signal.

Fortunately, some known bidirectional signal interfaces do not require direction signals.

But these bidirectional signal interfaces may have undesirable characteristics. For example, existing interfaces may be relatively slow, and thus may limit the signal bandwidth between the coupled circuits. Furthermore, existing interfaces may consume a significant amount of power in a standby condition, i.e., during a period of no signal transitions.

SUMMARY

According to an embodiment of the invention, a bidirectional signal interface includes first and second nodes and first and second translating circuits. The first and second nodes are respectively operable to receive a first logic signal and a second logic signal. The first translating circuit has a first signal path coupled between the first and second nodes, is operable to sense a transition of the first logic signal on the first node, and, in response to the transition, is operable to couple the first logic signal to the second node via the first signal path. The second translating circuit has a second signal path that is coupled between the first and second nodes and that is parallel to the first signal path, is operable to sense a transition of the second logic signal on the second node, and, in response to the transition of the second logic signal, is operable to couple the second logic signal to the first node via the second signal path.

According to another embodiment of the invention, the first signal path may not be parallel to the second signal path, the first translating circuit is, in response to the transition of the first logic signal, operable to disable the second translating circuit from coupling the second logic signal to the first node for a first predetermined time, and the second translating circuit is, in response to the transition of the second logic signal, operable to disable the first translating circuit from coupling the first logic signal to the second node for a second predetermined time.

Such embodiments of a bidirectional signal interface may be faster and consume less standby power than prior interfaces.

BRIEF DESCRIPTION OF THE DRAWINGS

FIG. 6 is a schematic diagram of the buffer of FIG. 4 according to an embodiment of the invention.

FIG. 7 is a schematic diagram of the high-voltage-to-low-voltage unidirectional translator of FIG. 2 according to an embodiment of the invention.

FIG. 8 is a schematic diagram of the buffer of FIG. 7 according to an embodiment of the invention.

DETAILED DESCRIPTION

Figure 1:
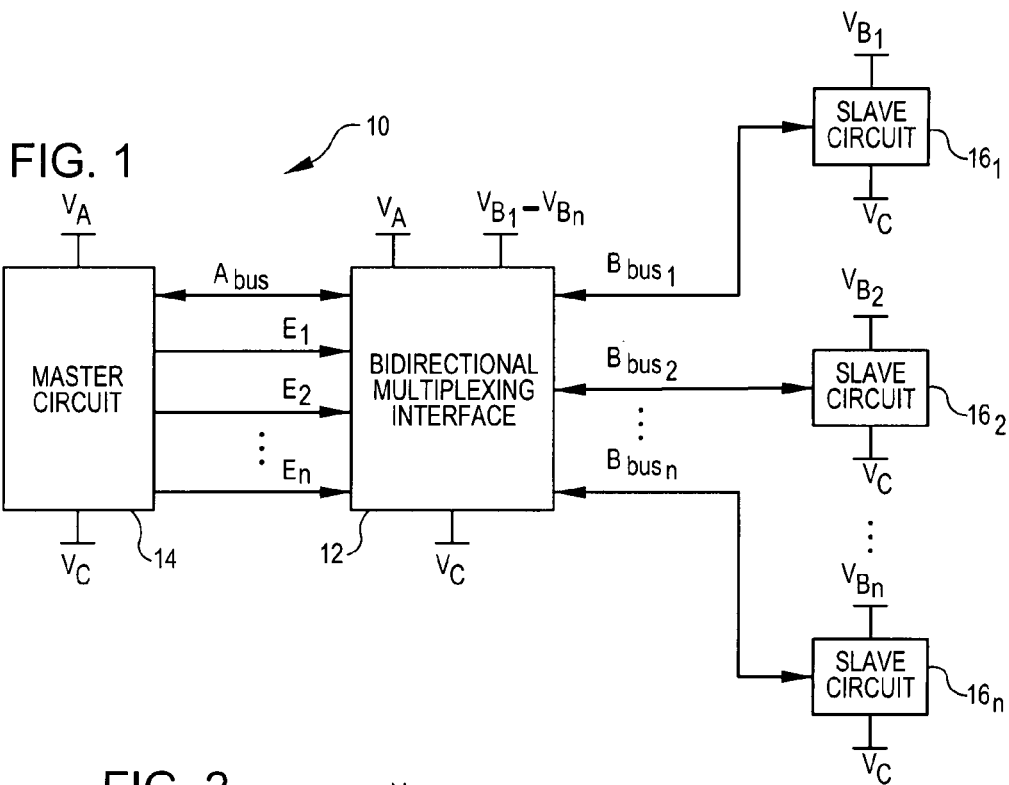
FIG. 1 is a diagram of an electronic system that includes a bidirectional signal interface according to an embodiment of the invention.

FIG. 1 is a diagram of an electronic system 10, which includes a bidirectional signal interface 12 with multiplexing capability according to an embodiment of the invention. As discussed below in conjunction with FIGS. 2-8, the interface 12 may be faster and consume less standby power than prior bidirectional interfaces, and may also provide other advantages over prior interfaces.

In addition to the interface 12, the system 10 includes a master circuit 14, which is powered by a low supply voltage $V_A$ and a common supply voltage $V_C$, and includes one or more slave circuits $16_1$-$16_n$, which are powered by $V_C$ and by respective independent high supply voltages $V_{B1}$-$V_{Bn}$, which may be the same or different. For example, the system 10 may be a cell phone, the master circuit 14 may be a microprocessor that is powered by $V_A$=1.8 V and $V_C$=0 V (ground), and the slave circuits $16_1$-$16_n$ may be nonvolatile memory circuits that are powered by $V_{B1}$-$V_{Bn}$=2.7 V and $V_C$=0 V and that each store respective cell-phone-configuration firmware (for clarity, other components of the cell phone are omitted from FIG. 1). For example, the memory $16_1$ may store firmware that configures the cell phone for operation in the U.S., and the memory $16_2$ may store firmware that configures the cell phone for operation in Europe.

The master circuit 14 sends and receives signals (e.g., data and address signals) via a bus $A_{bus}$, which, for example, may conform to the Secure Digital Input/Output (SDIO) or Multimedia Card (MMC) bus protocol, and generates enable signals $E_1$-$E_n$, which respectively correspond to the slave circuits $16_1$-$16_n$. Because the master circuit 14 is supplied by $V_A$ and $V_C$, the signals generated by the master circuit have a high logic level (e.g., a logic 1 level) equal to $V_A$, and have a low logic level (e.g., a logic 0 level) equal to $V_C$.

Similarly, each of the slave circuits $16_1$-$16_n$ sends and receives signals (e.g., data and address signals) via a respective bus $B_{bus1}$-$B_{busn}$, which, for example, may also conform to the SDIO or MMC bus protocol. Because the slave circuits $16_1$-$16_n$ are supplied by $V_{B1}$-$V_{Bn}$ and $V_C$, the signals generated by the slave circuits have high logic levels respectively equal to $V_{B1}$-$V_{Bn}$, and have low logic levels equal to $V_C$.

In operation, the interface circuit 12 couples and translates signals from the master circuit 14 to a selected one of the slave circuits $16_1$-$16_n$, and also couples and translates signals from the selected slave circuit to the master circuit.

For example, suppose that the master circuit 14 is a processor, the slave circuits $16_1$-$16_n$ are memories, and the master circuit wishes to read data from the slave circuit $16_1$.

First, the master circuit 14 generates an active logic level (e.g., a high logic level) for the enable signal $E_1$, and drives onto $A_{bus}$ the address of the memory location to be read in the slave circuit $16_1$.

Next, in response to the active logic level for $E_1$, the interface 12 couples the address signals on $A_{bus}$ to $B_{bus1}$, and uncouples $B_{bus2}$-$B_{busn}$ from $A_{bus}$. Specifically, for address signals on $A_{bus}$ having a high logic level, the interface 12 translates these signals from voltage $V_A$ to voltage $V_{B1}$, and drives the translated signals onto the corresponding lines of $B_{bus1}$. For address signals on $A_{bus}$ having a low logic level, no translation is needed because the low logic level for both the master circuit 14 and the selected slave circuit $16_1$ equals $V_C$; consequently, the interface 12 drives these signals onto the corresponding lines of $B_{bus1}$ without translating them. Furthermore, as discussed below in conjunction with FIGS. 6, 8, and 14, the interface 12 may provide a temporary drive "boost" so that the signals that the interface drives onto $B_{bus1}$ have rise and/or fall times that are within a desired range, for example, of 1-100 nanoseconds (ns). Consequently, this temporary drive boost may increase the signal bandwidth of the interface 12 as compared to prior bidirectional interfaces.

Then, the selected slave circuit $16_1$ receives the $B_{bus1}$ address signals having the proper high and low voltage levels $V_{B1}$ and $V_C$, respectively, and, in response to these signals, retrieves the data from the addressed location.

Next, the selected slave circuit $16_1$ drives the retrieved data onto $B_{bus1}$.

Then, in response to the still-active logic level for $E_1$, the interface 12 couples the data signals on $B_{bus1}$ to $A_{bus}$, and maintains $B_{bus2}$-$B_{busn}$ uncoupled from $A_{bus}$. Specifically, for data signals on $B_{bus1}$ having a high logic level, the interface 12 translates these signals from voltage $V_{B1}$ to voltage $V_A$, and drives the translated signals onto the corresponding lines of $A_{bus}$. For data signals on $B_{bus1}$ having a low logic level, no translation is needed because the low logic level for both the master circuit 14 and the selected slave circuit $16_1$ equals $V_C$; consequently, the interface 12 drives these signals onto the corresponding lines of $B_{bus1}$ without translating them. Furthermore, as discussed above and as discussed below in conjunction with FIGS. 6, 8, and 14, the interface 12 may provide a temporary drive boost so that the signals that the interface drives onto $A_{bus}$ have rise and/or fall times that are within a desired range, for example, of 1-100 nanoseconds (ns).

Next, the master circuit 14 retrieves the requested data from $A_{bus}$.

The interface 12 continues coupling signals between master circuit 14 and selected slave circuit $16_1$ in the above-described manner until the master circuit indicates that it no longer wishes to communicate with the selected slave circuit by transitioning $E_1$ to an inactive logic level.

Then, in response to the inactive logic level for $E_1$, the interface 12 uncouples $B_{bus1}$ from $A_{bus}$, and maintains $B_{bus2}$-$B_{busn}$ uncoupled from $A_{bus}$.

Still referring to FIG. 1, other embodiments of the system 10 are contemplated. For example, $V_A$ may be greater than or equal to some or all of $V_{B1}$-$V_{Bn}$; for the ones of $V_{B1}$-$V_{Bn}$ equal to $V_A$, the interface 12 need not translate the high logic levels of signals from the master circuit 14 or from the slave circuits $16_1$-$16_n$. Furthermore, although not shown in FIG. 1, the slave circuits $16_1$-$16_n$ may respectively receive the enable signals $E_1$-$E_n$; where the slave circuits do not receive $E_1$-$E_n$, the master circuit 14 may send a predetermined initialization sequence via $A_{bus}$ and the interface 12 so that the selected slave circuit 16 "knows" that it has been selected. In addition, the slave circuits $16_1$-$16_n$ may be replaced with master circuits that generate enable signals such that any of the circuits $16_1$-$16_n$ can initiate communication with the master circuit 14. Moreover, the system 10 may include multiple master circuits 14 coupled to the same or respective busses $A_{bus}$. Furthermore, the master circuit 14 may be other than a processor, and the slave circuits $16_1$-$16_n$ may be other than memories. In addition, although shown as separate integrated circuits (ICs) in FIG. 1, one or more of the interface 12, master circuit 14, and slave circuits $16_1$-$16_n$ may be disposed on the same IC die, such as where the system 10 or a portion of the system is disposed on a single IC die. Moreover, the master circuit 14 may simultaneously send signals to multiple slave circuits 16 by activating multiple ones of the enable signals $E_1$-$E_n$. Furthermore, the master circuit 14 and slave circuits $16_1$-$16_n$ may receive different low-supply voltages $V_C$, in which case the interface 12 may translate low logic levels.

Figure 2:
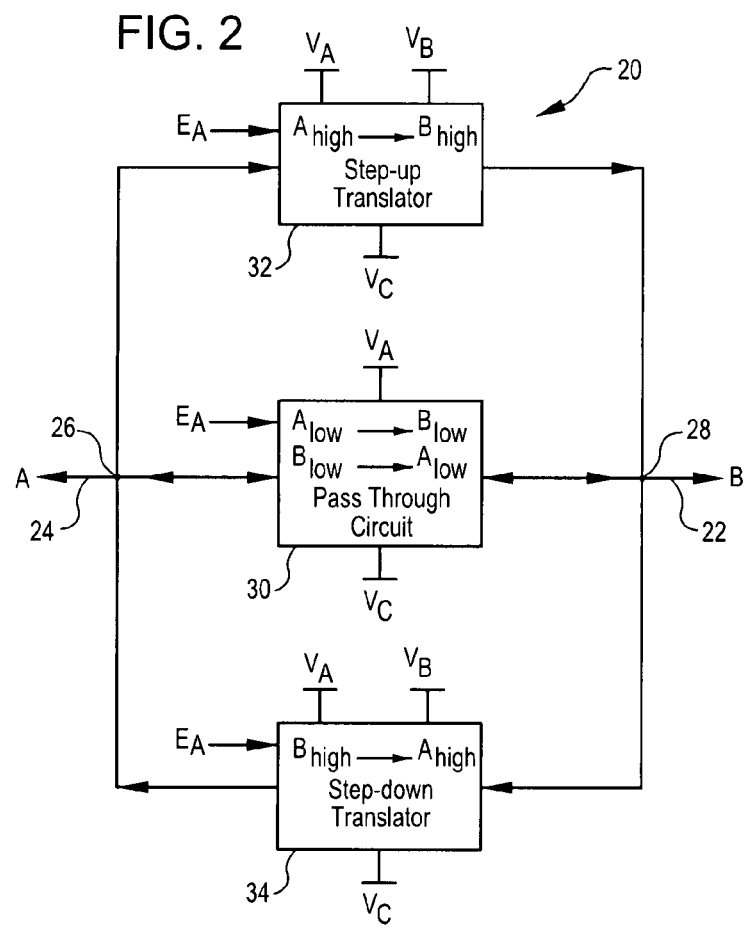
FIG. 2 is a diagram of a portion of the bidirectional interface of FIG. 1 for coupling a signal node of a first circuit to a corresponding signal node of a second circuit according to an embodiment of the invention.

FIG. 2 is a schematic diagram of a coupling circuit 20 of the interface circuit 12 (FIG. 1) where the coupling circuit is operable to couple a single line of $A_{bus}$ to a corresponding line of the selected $B_{bus}$ according to an embodiment of the invention. The interface circuit 12 includes a respective coupling circuit 20 for each line 22 of the busses $B_{bus1}$-$B_{busn}$ (FIG. 1). For example, suppose that $A_{bus}$ (FIG. 1) includes six lines $24_1$-$24_6$ (only one line 24 shown in FIG. 2), and $B_{bus1}$-$B_{busn}$ each include six respective corresponding lines $22_1$-$22_6$ (only one line 22 shown in FIG. 2). Therefore, for $B_{bus1}$, the interface circuit 12 includes six coupling circuits 20 for respectively coupling signals between lines $22_1$ of $A_{bus}$ and $24_1$ of $B_{bus1}$, lines $22_2$ ($A_{bus}$) and $24_2$ ($B_{bus1}$) lines $22_3$ and $24_3$, lines $22_4$ and $24_4$, lines $22_5$ and $24_5$, and lines $22_6$ and $24_6$. Likewise, the interface circuit 12 includes six respective coupling circuits 20 for each of $B_{bus2}$-$B_{busn}$, for a total of 6·n coupling circuits 20 for the busses $B_{bus1}$-$B_{busn}$. Furthermore, A references the logic signal carried by an arbitrary line 24 of $A_{bus}$, B references the logic signal carried by the corresponding line 22 of the selected one of $B_{bus1}$-$B_{busn}$, $E_A$ references the one of the enable signals $E_1$-$E_n$ that corresponds to the selected one of $B_{bus1}$-$B_{busn}$, and $V_B$ references the one of the slave supply voltages $V_{B1}$-$V_{Bn}$ that corresponds to the selected one of $B_{bus1}$-$B_{busn}$. Moreover, $A_{high}$ and $B_{high}$ respectively represent the high logic levels $V_A$ and $V_B$ of the signals A and B, and $A_{low}$ and $B_{low}$ respectively represent the low logic level $V_C$ of the signals A and B.

The coupling circuit 20 includes a node 26 coupled to the $A_{bus}$ line 24 and a node 28 coupled to the selected $B_{bus}$ line 22, and includes a pass-through circuit 30, a step-up translator 32, and a step-down translator 34 coupled in parallel between the nodes 26 and 28.

The nodes 26 and 28 may be external pins of the interface 12, or, if the interface is disposed on the same die as the master circuit 14 or the slave circuit(s) 16, the nodes 26 and 28 may be internal nodes on the die.

The pass-through circuit 30 receives the supply voltages $V_A$ and $V_C$, and is operable to receive a low logic level $A_{low}$ that the master circuit 14 drives onto the node 26, and to couple $A_{low}$ to the node 28 as a corresponding low logic level $B_{low}$; the pass-through circuit 30 is also operable to receive a low logic level $B_{low}$ that the selected slave circuit 16 drives onto the node 28, and to couple $B_{low}$ to the node 26 as a corresponding low logic level $A_{low}$. Because in this embodiment $A_{low}$=$B_{low}$=$V_C$, no voltage-level translation is needed to convert $A_{low}$ to $B_{low}$ and vice versa. Furthermore, because in this embodiment $V_C$ is less than $V_A$ and $V_B$, the pass-through circuit 30 need only receive the lower of these two supply voltages, which is $V_A$ in this embodiment. The pass-through circuit 30 is further described below in conjunction with FIG. 3.

The step-up translator 32 receives the supply voltages $V_A$, $V_B$, and $V_C$, and is operable to receive the high logic level $A_{high}$ that the master circuit 14 drives onto the node 26, and convert $A_{high}$ into a corresponding high logic level $B_{high}$, and then drive $B_{high}$ onto the node 28. For example, suppose that the master circuit 14 (FIG. 1) transitions the signal A on the node 26 from $A_{low}$ to $A_{high}$ while the enable signal $E_A$ has an active level. In response to this transition, the step-up translator 32 transitions the signal B on the node 28 from $B_{low}$ to $B_{high}$ with a relatively high drive strength so that the rise time of B is within a desired range, e.g., 1-100 ns, that depends on the application. Thereafter, the translator 32 maintains the level $B_{high}$ on the node 28 with a lower drive strength until one of the following actions occurs: the master circuit 14 transitions A back to $A_{low}$, the selected slave circuit 16 transitions B back to $B_{low}$, or the master circuit transitions $E_A$ to an inactive level—the lower drive strength allows the master circuit to transition A back to $A_{low}$ or the slave circuit to transition B back to $B_{low}$ without the interface 12 consuming an excessive amount of power as compared to prior interfaces. The step-up translator 32 is further described below in conjunction with FIGS. 4-6.

The step-down translator 34 receives the supply voltages $V_A$, $V_B$, and $V_C$, and is operable to receive a high logic level $B_{high}$ that the selected slave circuit 16 drives onto the node 28, convert $B_{high}$ into a corresponding high logic level $A_{high}$, and then drive $A_{high}$ onto the node 26. For example, suppose that the selected slave circuit 16 (FIG. 1) transitions the signal B on the node 28 from $B_{low}$ to $B_{high}$ while the enable signal $E_A$ has an active level. In response to this transition, the translator 34 transitions the signal A on the node 26 from $A_{low}$ to $A_{high}$ with a relatively high drive strength so that the rise time of A is within a desired range, e.g., 1-100 ns, that depends on the application. Thereafter, the translator 34 maintains the level $A_{high}$ on the node 26 with a lower drive strength until one of the following actions occurs: the selected slave circuit 16 transitions B back to $B_{low}$, the master circuit 14 (FIG. 1) transitions A back to $A_{low}$, or the master circuit transitions $E_A$ to an inactive level—the lower drive strength allows the slave circuit to transition B back to $B_{low}$ or the master circuit to transition A back to $A_{low}$ without the interface 12 consuming an excessive amount of power as compared to prior interfaces. The step-down translator 34 is further described below in conjunction with FIGS. 7-8.

Figure 3:
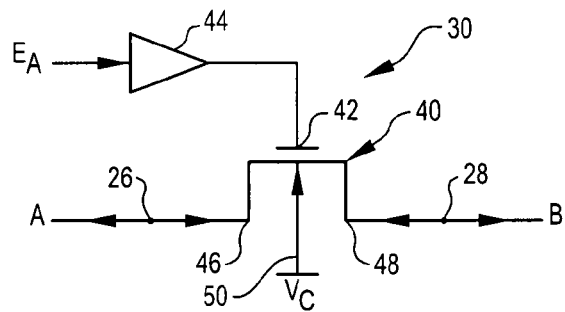
FIG. 3 is a schematic diagram of the pass circuit of FIG. 2 according to an embodiment of the invention.

FIG. 3 is a schematic diagram of the pass-through circuit 30 of FIG. 2 according to an embodiment of the invention.

The circuit 30 includes an NMOS transistor 40 having its gate node 42 coupled to $E_A$ via a buffer 44, one source/drain node 46 coupled to the A-side node 26, the other source/drain node 48 coupled to the B-side node 28, and a body node 50 coupled to $V_C$. The threshold voltage of the transistor 40 is less than the difference $V_A$-$V_C$. For example, the threshold voltage of the transistor 40 may be approximately 0.5 V.

In operation, while $E_A$ has an active high logic level $V_A$, the buffer 44 drives a voltage equal to $V_A$ onto the gate node 42. As long as at least one of the nodes 26 and 28 respectively carries a low logic level $A_{low}$ or $B_{low}$, the voltage $V_A$ at the gate node 42 turns the transistor 40 "on" such that the transistor presents a low impedance, typically a few ohms or less, between the nodes 26 and 28.

If the master circuit 14 (FIG. 1) drives $A_{low}$=$V_C$ onto the node 26, then the "on" transistor 40 is operable to couple $A_{low}$ from the node 26 to the node 28 as $B_{low}$=$V_C$.

Likewise, if the selected slave circuit 16 (FIG. 1) drives $B_{low}$=$V_C$ onto the node 28, then the "on" transistor 40 is operable to couple $B_{low}$ from the node 28 to the node 26 as $A_{low}$=$V_C$.

Alternate embodiments of the pass-through circuit 30 are contemplated. For example, where $V_A$ and $V_B$ are negative voltages, the transistor 40 may be a PMOS transistor.

Figure 4:
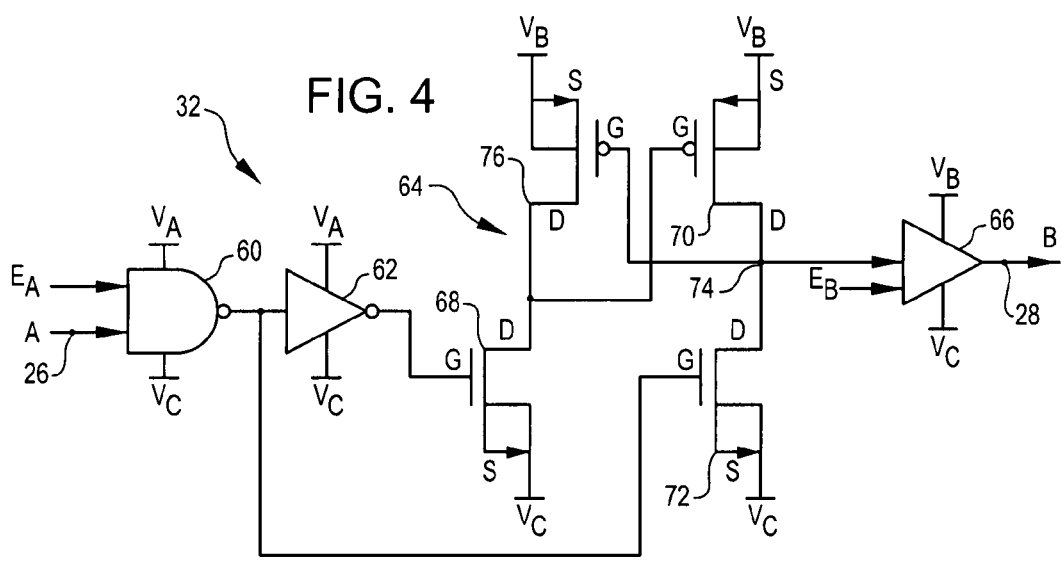
FIG. 4 is a schematic diagram of the low-voltage-to-high-voltage unidirectional translator of FIG. 2 according to an embodiment of the invention.

FIG. 4 is a schematic diagram of the step-up translator 32 of FIG. 2 according to an embodiment of the invention, where $E_B$ represents the stepped-up enable signal $E_A$. That is, if the signal $E_A$ has an active high level $E_{Ahigh}$=$V_A$, then the corresponding signal $E_B$ has an active high logic level $E_{Bhigh}$=$V_B$. A translator for converting $E_{Ahigh}$ to $E_{Bhigh}$ is described below in conjunction with FIG. 5.

The step-up translator 32 includes a NAND gate 60, an inverter 62, a four-transistor step-up latch 64, and a drive buffer 66. The NAND gate 60 and inverter 62 are supplied by $V_A$ and $V_C$, and the latch 64 and driver buffer 66 are supplied by $V_B$ and $V_C$.

In operation, while either the signal A or the signal $E_A$ has a low logic level $A_{low}$=$E_{Alow}$=$V_C$, the buffer 66 presents a high output impedance to the node 28. That is, the output of the buffer 66 drives no signal level onto the node 28 so that another circuit, such as the pass-through circuit 30 (FIG. 2) or the selected slave circuit 16 (FIG. 1), can dictate the voltage level at the node 28.

But when $E_A$=$E_{Ahigh}$ and the master circuit 14 (FIG. 1) transitions the signal A to a high logic level $A_{high}$, the buffer 66 drives a high logic level $B_{high}$ onto the node 28. In response to a transition of the signal A from $A_{low}$ to $A_{high}$ while $E_A = E_{Ahigh}$, the NAND gate 60 generates at its output a low logic level $A_{low}$, and the inverter 62 generates at its output a high logic level $A_{high}$. In response to these output voltages $A_{low}$ and $A_{high}$ on their respective gates G, an NMOS transistor 68 of the latch 64 turns "on" and pulls the gate G of a PMOS transistor 70 to approximately $V_C$, and an NMOS transistor 72 turns "off" and draws no current. In response to the voltage $V_C$ at its gate G, the PMOS transistor 70 turns "on" and pulls a latch-output node 74 up to the voltage $V_B$. The buffer 66 then drives this voltage $V_B$ onto the node 28 to generate the signal B having the high logic level $B_{high} = V_B$. If the signal B is at $B_{low}$ before A transitions to $A_{high}$, then, as further described below in conjunction with FIG. 6, because the buffer 66 drives the node 28 with a relatively high drive strength for a predetermined time, B transitions from $B_{low}$ to $B_{high}$ with a desired rise time; after the elapse of the predetermined time, the buffer 66 drives the node 28 with a relatively low drive strength.

When the master circuit 14 (FIG. 1) transitions $E_A$ back to $E_{Alow}$ or transitions A back to $A_{low}$, the output of the buffer 66 presents a high impedance at the node 28. In response to a transition of the signal $E_A$ from $E_{Ahigh}$ to $E_{Alow}$ or the transition of A from $A_{high}$ to $A_{low}$, the NAND gate 60 generates at its output a high logic level $A_{high}$, and the inverter 62 generates at its output a low logic level $A_{low}$. In response to these output voltages $A_{high}$ and $A_{low}$, the NMOS transistor 68 turns "off", and the NMOS transistor 72 turns "on", and thus pulls down the latch-output node 74 to $V_C$. In response to the voltage $V_C$ at its gate G, a PMOS transistor 76 turns "on" and pulls up the gate of the PMOS transistor 70 to $V_B$, thus turning the transistor 70 "off". In response to the voltage $V_C$ at its input, the buffer 66 turns "off" and presents a high output impedance at the node 28.

Still referring to FIG. 4, other embodiments of the step-up translator 32 are contemplated. For example, one may replace the step-up latch 64 with its dual if $V_A$ and $V_B$ are negative relative to $V_C$.

Figure 5:
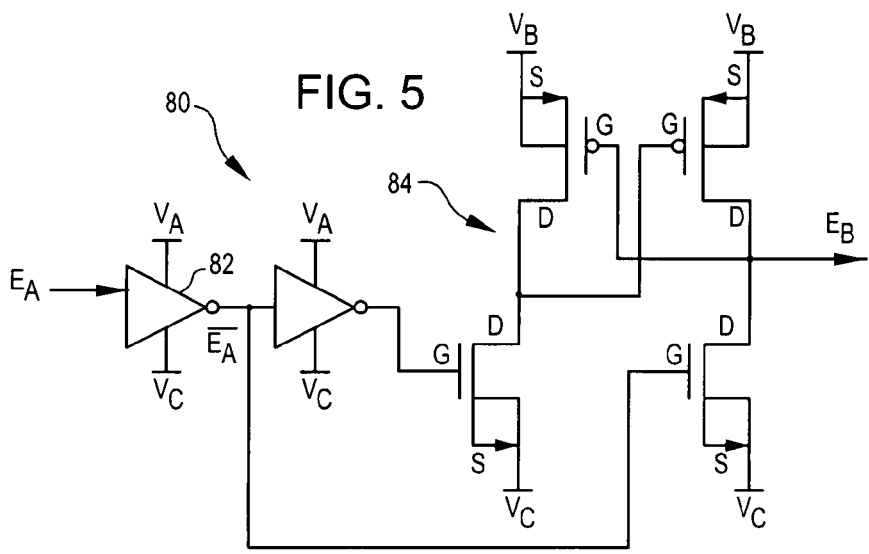
FIG. 5 is a schematic diagram of the enable-signal translator of FIG. 4 according to an embodiment of the invention.

FIG. 5 is a schematic diagram of a step-up translator 80 for converting the enable signal $E_A$ into the stepped-up enable signal $E_B$ of FIG. 4 according to an embodiment of the invention.

The translator 80 is similar to the translator 32 of FIG. 4 in both structure and operation, except that the translator 80 lacks an output buffer like the buffer 66, and includes an inverter 82 in place of the NAND gate 60. In response to the master circuit 14 (FIG. 1) transitioning $E_A$ from $E_{Alow} = V_C$ to $E_{Ahigh} = V_A$, a step-up latch 84, which is similar to the latch 64 (FIG. 4), transitions $E_B$ from $E_{Blow} = V_C$ to $E_{Bhigh} = V_B$, and maintains $E_B$ at $E_{Bhigh}$ as long as the master circuit maintains $E_A$ at $E_{Ahigh}$. Conversely, in response to the master circuit 14 transitioning $E_A$ from $E_{Ahigh}$ to $E_{Alow}$, the latch 84 transitions $E_B$ from $E_{Bhigh}$ to $E_{Blow}$, and maintains $E_B$ at $E_{Blow}$ as long as the master circuit maintains $E_A$ at $E_{Alow}$.

FIG. 6 is a schematic diagram of the buffer 66 of FIG. 4 according to an embodiment of the invention.

The buffer 66 includes a high-strength drive path 90, and a low-strength drive path 92.

The high-strength drive path 90 includes a delay inverter 94 and a three-input NAND gate 96, which are supplied by $V_B$ and $V_C$, and a "strong" PMOS drive transistor 98, which is supplied by $V_B$.

The low-strength drive path 92 includes a two-input NAND gate 100, which is supplied by $V_C$ and $V_B$, a "weak" PMOS drive transistor 102, which is supplied by $V_B$, and an optional pull-up resistor 104. If the pull-up resistor 104 is present, then it may render the transistor 102 weak even if the transistor 102 alone is not a weak transistor.

As discussed above in conjunction with FIG. 4, before the master circuit 14 (FIG. 1) transitions $E_A$ to $E_{Ahigh}$ and A to $A_{high}$, the transistor 72 (FIG. 4) pulls the voltage at the node 74 to $V_C$.

Consequently, the transistors 98 and 102 are both "off". The voltage $V_C$ at the node 74 forces the voltage at the output of the delay inverter 94 to $V_B$, which forces the voltage at the output of the NAND gate 96 to $V_B$ and thus turns the transistor 98 "off". Similarly, the voltage $V_C$ at the node 74 also forces the voltage at the output of the NAND gate 100 to $V_B$, and thus turns the transistor 102 "off".

Also as discussed above in conjunction with FIG. 4, when $E_A$ equals active level $E_{Ahigh}$ (and thus when $E_B$ equals $E_{Bhigh}$), the transistor 70 (FIG. 4) pulls the node 74 up from $V_C$ to $V_B$ in response to the master circuit 14 (FIG. 1) transitioning A to $A_{high}$.

Still referring to FIG. 6, in response to $E_B = E_{Bhigh}$ and the voltage at the node 74 transitioning from $V_C$ to $V_B$, all of the signals input to the NAND gate 96 equal $V_B$, thus forcing the output of the NAND gate 96 to $V_C$ and turning "on" the transistor 98. The transistor 98 is designed to present a relatively low output impedance (a few ohms or less) to the node 28, and thus has a relatively high drive strength. Therefore, the transistor 98 drives the signal B from Blow to Bhigh relatively quickly, e.g., with a rise time in the range of 1-100 ns.

Also in response to $E_B = E_{Bhigh}$ and the voltage at the node 74 transitioning from $V_C$ to $V_B$, all of the signals input to the NAND gate 100 equal $V_B$, thus forcing the output of the NAND gate 100 to $V_C$ and turning "on" the transistor 102. The combination of the transistor 102 and resistor 104 (if included) is designed to present to the node 28 an output impedance (e.g., 100 kΩ) that is higher than the output impedance presented by the transistor 98; consequently, the combination of the transistor 102 and the resistor (if included) has a relatively low drive strength. Alternatively, the resistor 104 may be omitted, and the transistor 102 may be designed to present to the node 28 the desired output impedance.

But because the drive paths 90 and 92 are in parallel, the overall drive strength of the buffer 66 is relatively strong while both of the transistors 98 and 102 are "on".

Still referring to FIG. 6, after a predetermined time that is greater than or equal to the desired rise time of the signal B, the NAND gate 96 turns "off" the transistor 98 such that the overall drive strength of the buffer 66 becomes weak. After the propagation delay time (e.g., 3.5 ns) through the delay inverter 94, the voltage $V_B$ on the node 74 forces the output of the inverter to $V_C$. After the propagation delay time (e.g., 0.3 ns) through the NAND gate 96, the voltage $V_C$ at the middle input node of this NAND gate forces the output node of this NAND gate to $V_B$, thus turning "off" the strong transistor 98 after a short propagation delay time (e.g., 0.2 ns) through the transistor. Because only the weak transistor 100 remains "on", the drive strength of the buffer 66 becomes relatively low strength a predetermined time (e.g., 4.0 ns) after the voltage at the node 74 transitions from $V_C$ to $V_B$, where this predetermined time equals the sum of the propagation delays through the inverter 94, NAND gate 96, and transistor 98. One may set this predetermined time to a desired value by, e.g., adjusting the delay of the inverter 94.

The buffer 66 weakly maintains the signal B at the node 28 at $B_{high}$ until either the master circuit 14 (FIG. 1) transitions the signal A at the node 26 (FIG. 4) to $A_{low}$, or the selected slave circuit 16 (FIG. 1) transitions the signal B at the node 28 to $B_{low}$.

In response to the master circuit 14 (FIG. 1) transitioning the signal A to $A_{low}$, the NMOS transistor 72 (FIG. 4) pulls the node 74 down to $V_C$, which forces the outputs of both the NAND gates 96 and 100 to $V_B$, and which thus turns "off" both of the transistors 98 and 100. Because the transistors 98 and 100 are "off", the pass-through circuit 30 (FIGS. 2 and 3) pulls the signal B at the node 28 to $B_{low}=V_C$ relatively easily, and maintains B at $B_{low}$ while drawing little or no quiescent current from the buffer 66. Consequently, the buffer 66 consumes less quiescent power while B is at $B_{low}$ than a buffer having only a passive pull-up element such as a resistor.

Conversely, in response to the selected slave circuit 16 (FIG. 1) transitioning the signal B to $B_{low}$ before the master circuit 14 (FIG. 1) transitions A to $A_{low}$ or $E_A$ to $E_{Alow}$, the transistor 102 may source a relatively small quiescent current to the node 28 for a relatively short period of time. Because the transistor 102 is a weak transistor (or is rendered weak by the resistor 104), this quiescent current is relatively small, and is thus insufficient to prevent B from transitioning to $B_{low}$. Furthermore, in response to $B_{low}$ at the node 28, the pass-through circuit 30 (FIGS. 2 and 3) transitions the signal A at the node 26 to $A_{low}$, which turns the transistors 98 and 102 "off", and which thus reduces or eliminates the quiescent current sourced to the node 28 by the buffer 66, as described above. Therefore, when the selected slave circuit 16 transitions B from $B_{high}$ to $B_{low}$, the time (e.g., 5-150 ns) during which the buffer 66 may source a significant quiescent current to the node 28 is limited to the sum of the propagation delay through the pass circuit 30 (from the node 28 to the node 26) and the propagation delay through the step-up translator 32 (from the node 26 to the node 28).

Consequently, because the magnitude and duration of the quiescent current that the buffer 66 may source to the node 28 are relatively small, the interface 12 (FIG. 1) may consume significantly less quiescent power than prior interfaces.

Referring to FIGS. 4-6, alternate embodiments of the step-up translator 32 are contemplated. For example, the latches 64 and 84 and the transistors 98 and 102 may be replaced by their respective duals if $V_A$ and $V_B$ are less than $V_C$.

FIG. 7 is a schematic diagram of the step-down translator 34 of FIG. 2 according to an embodiment of the invention, where the translator 80 of FIG. 5 translates $E_A$ into $E_B$.

The translator 34 includes a NAND gate 110, an inverter 112, and a drive buffer 114. The NAND gate 110 and inverter 112 are supplied by $V_B$ and $V_C$, and the driver buffer 114 is supplied by $V_A$ and $V_C$.

In operation, while either the signal B or the signal $E_B$ has a low logic level $B_{low}=E_{Blow}=V_C$, the buffer 114 presents a high output impedance to the node 26 so that another circuit, such as the pass-through circuit 30 (FIG. 2) or the master circuit 14 (FIG. 1), can dictate the voltage level at the node 26.

But when $E_B=E_{Bhigh}$ and the selected slave circuit 16 (FIG. 1) transitions the signal B to a high logic level $B_{high}$, the buffer 114 drives a high logic level $A_{high}$ onto the node 26. In response to a transition of the signal B from $B_{low}$ to $B_{high}$ while $E_B=E_{Bhigh}$, the NAND gate 110 generates at its output a low logic level $B_{low}$, and the inverter 112 generates at its output a high logic level $B_{high}$. In response to the output voltage $B_{high}=V_B$ on a node 116, the buffer 114 drives a voltage $V_A$ onto the node 26 to generate the signal A having the high logic level $A_{high}=V_A$. If the signal A is at $A_{low}$ before B transitions to $B_{high}$, then, as further described below in conjunction with FIG. 8, because the buffer 110 drives the node 26 with a relatively high drive strength for a predetermined time, A transitions from $A_{low}$ to $A_{high}$ with a desired rise time; after the elapse of the predetermined time, the buffer 114 drives the node 26 with a relatively low drive strength.

When the master circuit 14 (FIG. 1) transitions $E_A$ to $E_{Alow}$ (thus effectively transitioning $E_B$ to $E_{Blow}$) or the selected slave circuit 16 (FIG. 1) transitions B to $B_{low}$, the output of the buffer 114 presents a high impedance at the node 26. In response to a transition of the signal $E_B$ from $E_{Bhigh}$ to $E_{Blow}$ or the transition of B from $B_{high}$ to $B_{low}$, the NAND gate 110 generates at its output a high logic level $B_{high}$, and the inverter 112 generates at its output a low logic level $B_{low}$. In response to the level $B_{low}$ on the node 116, the buffer 114 turns "off" and presents a relatively high output impedance at the node 26.

Still referring to FIG. 7, other embodiments of the step-down translator 34 are contemplated.

FIG. 8 is a schematic diagram of the buffer 114 of FIG. 6 according to an embodiment of the invention. The buffer 114 is similar in topology and operation to the buffer 66 of FIGS. 4 and 6, except that the components of the buffer 114 are supplied by $V_A$ and $V_C$ instead of by $V_B$ and $V_C$, and the output of the buffer is coupled to the node 26 instead of to the node 28. Therefore, a detailed discussion of the buffer 114 is omitted for brevity.

Figure 9:
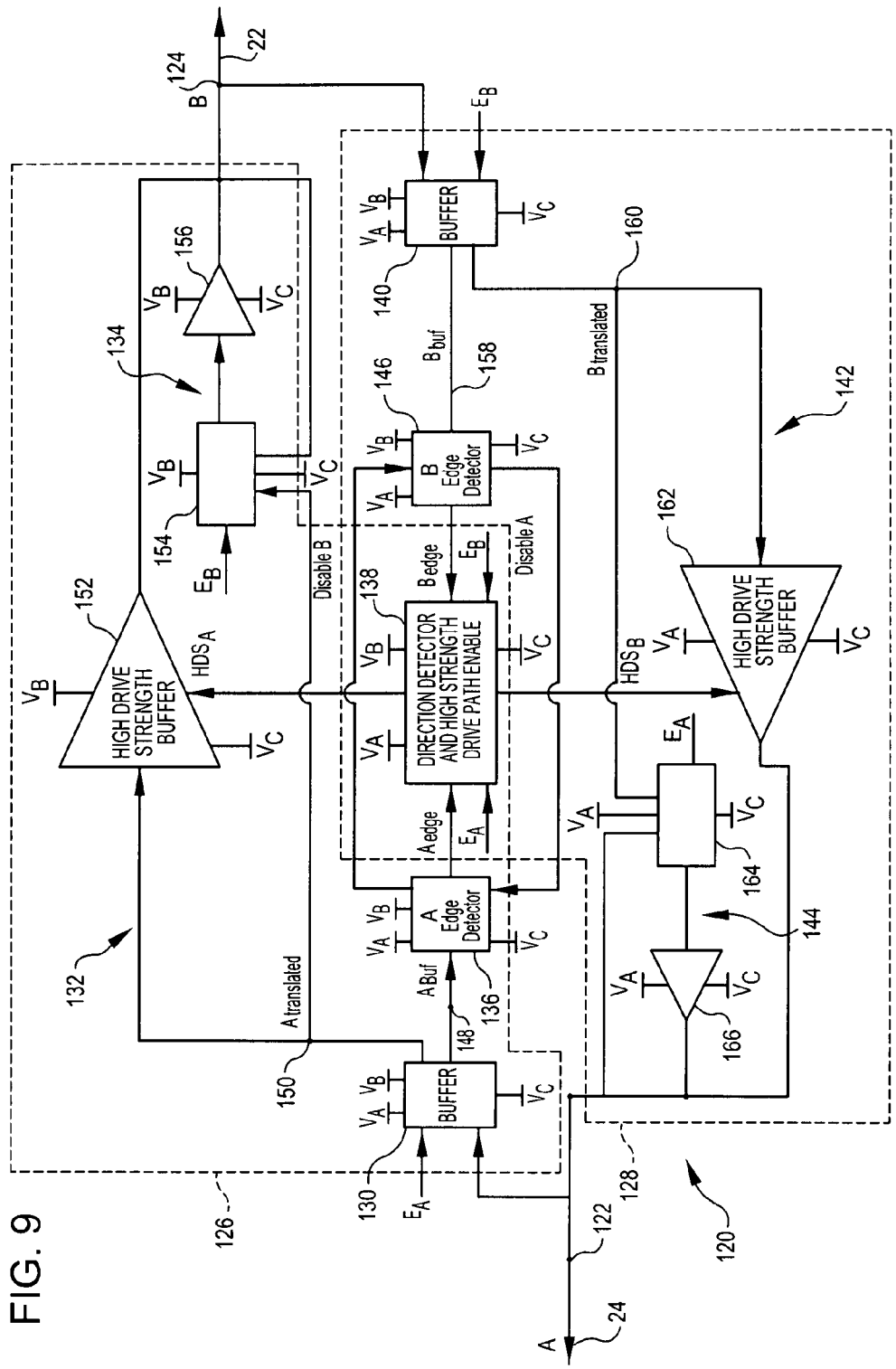
FIG. 9 is a diagram of a portion of the bidirectional interface of FIG. 1 for coupling a signal node of a first circuit to a corresponding signal node of a second circuit according to another embodiment of the invention.

FIG. 9 is a schematic diagram of a coupling circuit 120 of the interface circuit 12 (FIG. 1), where the coupling circuit is operable to couple a single line of $A_{bus}$ (FIG. 1) to a corresponding line of the selected $B_{bus}$ (FIG. 1) according to another embodiment of the invention. The coupling circuit 120 is an alternative to the coupling circuit 20 (FIG. 2). Therefore, in this embodiment, the interface circuit 12 includes a respective coupling circuit 120 for each line 22 of the busses $B_{bus1}$-$B_{busn}$ (FIG. 1), for a total of 6·n coupling circuits 120. The coupling circuit 120 may couple signals between the lines 22 and 24 faster (i.e., with less delay time) than the coupling circuit 20, particularly a signal transitioning from a high level to a low level. Consequently, the coupler circuit 120 may have a higher bandwidth than the coupling circuit 20.

The coupling circuit 120 includes nodes 122 and 124 respectively coupled to the $A_{bus}$ and selected $B_{bus}$ lines 24 and 22, a pass-through-and-step-up translator (hereinafter the step-up translator) 126 coupled between the nodes 122 and 124, and a pass-through-and-step-down translator (hereinafter the step-down translator) 128 also coupled between the nodes 122 and 124.

Like the nodes 26 and 28 of the coupling circuit 20 (FIG. 2), the nodes 122 and 124 may be external pins of the interface 12; or, if the interface is disposed on the same die as the master circuit 14 or the slave circuit(s) 16 (FIG. 1), the nodes 122 and 124 may be internal nodes on the die.

The step-up translator 126 receives the supply voltages $V_A$, $V_B$, and $V_C$, is operable to receive the signal A that the master circuit 14 (FIG. 1) drives onto the node 122, and is operable to convert A into a corresponding signal B. Specifically, if $A=A_{low}=V_C$, then the translator 126 drives $V_C$ onto the node 124 such that the signal $B=B_{low}=V_C$. And if $A=A_{high}=V_A$, then the translator 126 converts $A_{high}$ into a corresponding high logic level $B_{high}=V_B$, and then drives $B_{high}$ onto the node 124 such that the signal $B=B_{high}$.

For example, suppose that the master circuit 14 (FIG. 1) transitions the signal A on the node 122 from $A_{low}$ to $A_{high}$ while the enable signal $E_A$ has an active level. In response to this transition, the step-up translator 126 transitions the signal B on the node 124 from $B_{low}$ to $B_{high}$ with a relatively high drive strength so that the rise time of B is within a desired range, e.g., 1-100 ns depending on the application. Furthermore, the step-up translator 126 disables the step-down translator 128 for a predetermined time (e.g., 1-200 ns) so that the step-down translator cannot drive a signal onto the node 122 while B is transitioning from $B_{low}$ to $B_{high}$. This may eliminate the noise that the step-down translator 128 may otherwise introduce onto the node 122. After the elapse of the predetermined time, the step-up translator 126 maintains the level $B_{high}$ on the node 124 with a lower drive strength until one of the following actions occurs: the master circuit 14 transitions A back to $A_{low}$, the selected slave circuit 16 transitions B back to $B_{low}$, or the master circuit transitions $E_A$ to an inactive level—the lower drive strength allows the master circuit to transition A back to $A_{low}$ or the slave circuit to transition B back to $B_{low}$ without the interface 12 consuming an excessive amount of power as compared to prior interfaces.

Similarly, suppose that the master circuit 14 (FIG. 1) transitions the signal A on the node 122 from $A_{high}$ to $A_{low}$ while the enable signal $E_A$ has an active level. In response to this transition, the step-up translator 126 transitions the signal B on the node 124 from $B_{high}$ to $B_{low}$ with a relatively high drive strength so that the fall time of B is within a desired range, e.g., 1-100 ns depending on the application. Furthermore, the step-up translator 126 disables the step-down translator 128 for a predetermined time (e.g., 1-200 ns) so that the step-down translator cannot drive a signal onto the node 122 while B is transitioning from $B_{high}$ to $B_{low}$. After the elapse of the predetermined time, the step-up translator 126 maintains the level $B_{low}$ on the node 124 with a lower drive strength until one of the following actions occurs: the master circuit 14 transitions A back to $A_{high}$, the selected slave circuit 16 transitions B back to $B_{high}$, or the master circuit transitions $E_A$ to an inactive level—the lower drive strength allows the master circuit to transition A back to $A_{high}$ or the slave circuit to transition B back to $B_{high}$ without the interface 12 consuming an excessive amount of power as compared to prior interfaces.

The step-up translator 126 is further described below in conjunction with FIGS. 10-16.

Still referring to FIG. 9, the step-down translator 128 receives the supply voltages $V_A$, $V_B$, and $V_C$, is operable to receive the signal B that the selected slave circuit 16 (FIG. 1) drives onto the node 124, and is operable to convert B into a corresponding signal A. Specifically, if $B=B_{low}=V_C$, then the translator 128 drives $V_C$ onto the node 122 such that the signal $A=A_{low}=V_C$. And if $B=B_{high}=V_B$, then the translator converts $B_{high}$ into a corresponding high logic level $A_{high}=V_A$, and then drives $A_{high}$ onto the node 122 such that the signal $A=A_{high}$.

For example, suppose that the selected slave circuit 16 (FIG. 1) transitions the signal B on the node 124 from $B_{low}$ to $B_{high}$ while the enable signal $E_B$ has an active level—a circuit such as the circuit 80 of FIG. 5 translates $E_A$ from the master circuit 14 (FIG. 1) into $E_B$. In response to this transition, the step-down translator 128 transitions the signal A on the node 122 from $A_{low}$ to $A_{high}$ with a relatively high drive strength so that the rise time of A from $A_{low}$ to $A_{high}$ is within a desired range, e.g., 1-100 ns, depending on the application. Furthermore, the step-down translator 128 disables the step-up translator 126 for a predetermined time (e.g., 1-200 ns) so that the step-up translator cannot drive a signal onto the node 124 while A is transitioning from $A_{low}$ to $A_{high}$. This may eliminate the noise that the step-up translator 126 may otherwise introduce onto the node 124. After the elapse of the predetermined time, the step-down translator 128 maintains the level $A_{high}$ on the node 122 with a lower drive strength until one of the following actions occurs: the master circuit 14 transitions A back to $A_{low}$, the selected slave circuit 16 transitions B back to $B_{low}$, or the master circuit transitions $E_A$ (and thus $E_B$) to an inactive level—the lower drive strength allows the master circuit to transition A back to $A_{low}$ or the slave circuit to transition B back to $B_{low}$ without the interface 12 consuming an excessive amount of power.

Similarly, suppose that the selected slave circuit 16 (FIG. 1) transitions the signal B on the node 124 from $B_{high}$ to $B_{low}$ while the enable signal $E_B$ has an active level. In response to this transition, the step-down translator 128 transitions the signal A on the node 122 from $A_{high}$ to $A_{low}$ with a relatively high drive strength so that the fall time of A is within a desired range, e.g., 1-100 ns, depending on the application. Furthermore, the step-down translator 128 disables the step-up translator 126 for a predetermined time (e.g., 1-200 ns) so that the step-up translator cannot drive a signal onto the node 124 while A is transitioning from $A_{high}$ to $A_{low}$. After the elapse of the predetermined time, the step-down translator 128 maintains the level $A_{low}$ on the node 122 with a lower drive strength until one of the following actions occurs: the master circuit 14 transitions A back to $A_{high}$, the selected slave circuit 16 transitions B back to $B_{high}$, or the master circuit transitions $E_A$ (and thus $E_B$) to an inactive level—the lower drive strength allows the master circuit to transition A back to $A_{high}$ or the slave circuit to transition B back to $B_{high}$ without the interface 12 consuming an excessive amount of power.

The step-down translator 128 is further described below in conjunction with FIGS. 10-16.

Still referring to FIG. 9, the step-up translator 126 includes an input buffer 130, high-drive-strength and low-drive-strength signal paths 132 and 134 coupled in parallel between the input buffer and the node 124, an A-signal edge detector 136 coupled to the input buffer, and a direction-detector-and-high-strength-drive-path-enable (DDHSDPE) circuit 138 coupled to the high-drive-strength path and to the edge detector.

Similarly, the step-down translator 128 includes an input buffer 140, high-drive-strength and low-drive-strength signal paths 142 and 144 coupled in parallel between the input buffer 140 and the node 122, a B-signal edge detector 146 coupled to the input buffer 140, and the DDHSDPE circuit 138, which is coupled to the high-drive-strength path 142 and to the edge detector 146. That is, the step-up translator 126 and the step-down translator 128 both "share" the DDHSDPE circuit 138.

Figure 10:
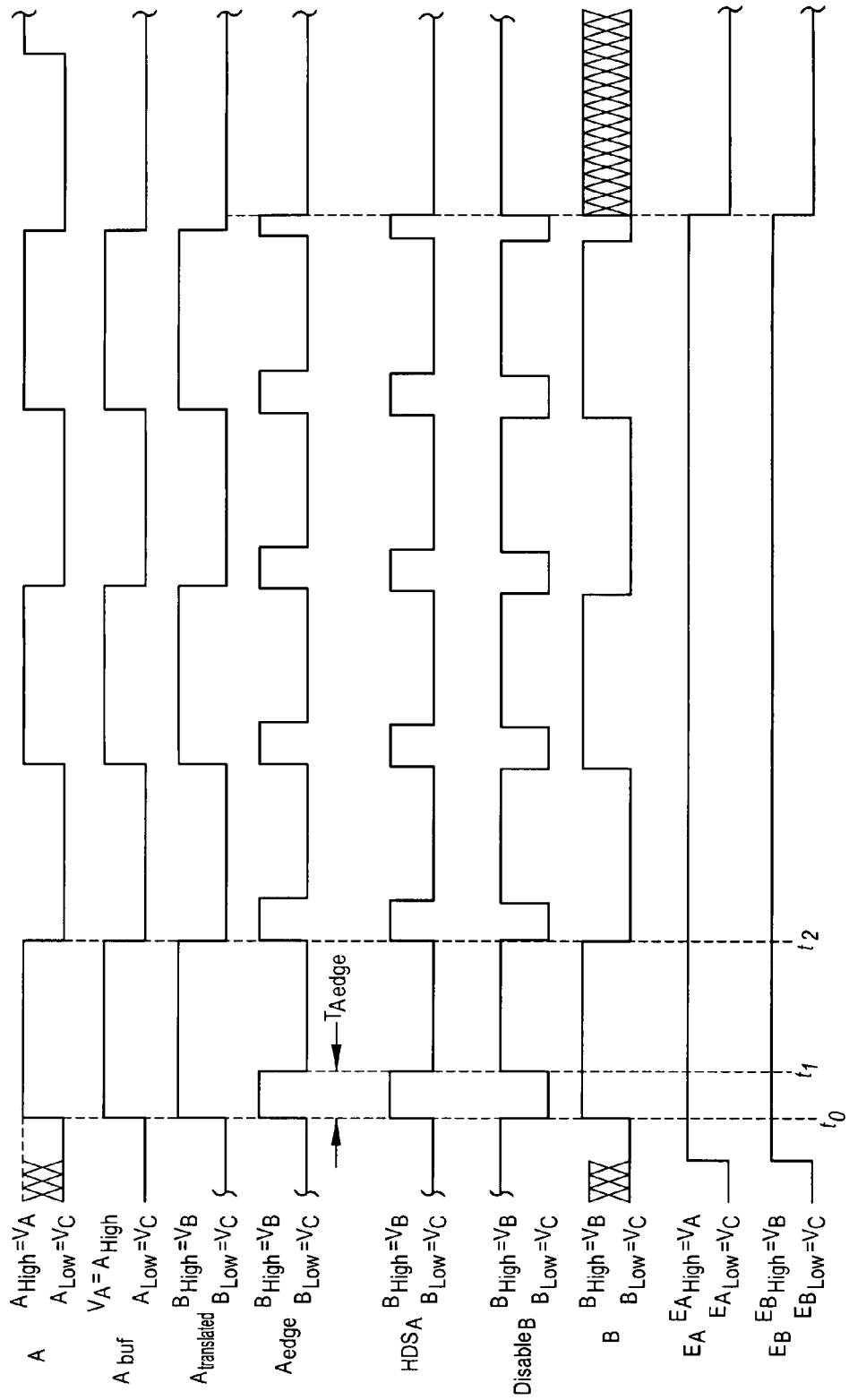
FIG. 10 is a timing diagram of signals in FIG. 9 according to an embodiment of the invention.

FIG. 10 is a timing diagram of the signal A and signals generated by the step-up translator 126 of FIG. 9 according to an embodiment of the invention. Although shown as having zero rise and fall times, it is understood that the signals have non-zero rise and fall times. Furthermore, although not shown, some of the signals may be delayed relative to other signals. For example, the edges of $A_{buf}$ and $A_{translated}$ may be delayed relative to the corresponding edges of A, and the edges of $HDS_A$ may be delayed relative to the corresponding edges of $A_{edge}$.

Referring to FIGS. 9-10, the input buffer 130 of the step-up translator 126 receives the supply voltages $V_A$, $V_B$, and $V_C$, and is operable to receive the signals A and $E_A$ generated by the master circuit 14 (FIG. 1), convert A into a corresponding signal $A_{buf}$ on a node 148, and convert A into a corresponding signal $A_{translated}$ on a node 150. The signal $A_{buf}$ has the same voltage level as the signal A, and thus is a buffered version of the signal A. The signal $A_{translated}$ has the same voltage level as a corresponding signal B would have. For example, if $A=A_{high}=V_A$, then $A_{translated}=B_{high}=V_B$; similarly, if $A=A_{low}=V_C$, then $A_{translated}=B_{low}=V_C$.

The high-drive-strength signal path 132 includes a high-drive-strength buffer 152, which receives the supply voltages $V_B$ and $V_C$ and which and is operable to convert the signal $A_{translated}$ on the node 150 into a corresponding signal B on the node 124 in response to a high-drive-strength enable signal $HDS_A$ from the DDHSDPE circuit 138. For example, if $A_{translated}=V_C$, then the buffer 152 converts $A_{translated}$ into $B=V_C=B_{low}$. Similarly, if $A_{translated}=V_B$, then the buffer 152 converts $A_{translated}$ into $B=V_B=B_{high}$. The buffer 152 drives the signal B onto the node 124 with a relatively high drive strength for the duration of the signal $HDS_A$ such that the signal B has a rise/fall time within a desired range, e.g., 1-100 ns. As discussed below, the signal $HDS_A$ has a duration that is at least as long as the desired rise/fall time of the signal B. Furthermore, the buffer 152 may be designed to make the rise time of B faster than the fall time of B, or vice versa.

The low-drive-strength signal path 134 includes a multiplexer 154 and a buffer 156, which both receive the supply voltages $V_B$ and $V_C$.

In response to $E_B$ having an active high level $V_B$, the multiplexer 154 couples $A_{translated}$ on the node 150 to the buffer 156, which drives $A_{translated}$ onto the node 124 as the signal B with a relatively low drive strength. While $HDS_A$ and $E_B$ are active, both the buffers 152 and 156 drive the signal $B=A_{translated}$ onto the node 124; consequently, the drive strength of the step-up translator 126 is high. But after $HDS_A$ returns to an inactive level, only the buffer 156 drives the signal B onto the node 124, such that the total drive strength of the step-up translator 126 is low. This low drive strength allows the buffer 152 to thereafter transition B in response to the master circuit 14 (FIG. 1) transitioning A, and allows the selected slave circuit 16 (FIG. 1) to thereafter transition B, without the interface 12 consuming an excessive amount of power.

Conversely, in response to $E_B$ having an inactive low level $V_C$, the multiplexer 154 couples the node 124 to the buffer 156; consequently, the multiplexer and the buffer form a weak latch that isolates the node 124 from the node 122 and that reinforces the level ($B_{high}$ or $B_{low}$) of the signal B on the node 124.

The A-signal edge detector 136 receives the supply voltages $V_A$, $V_B$, and $V_C$, is operable to generate a pulse $A_{edge}$ in response to each transition of the signal A from $A_{low}$ to $A_{high}$ and from $A_{high}$ to $A_{low}$ and is operable to generate a signal $DISABLE_B$ (which is equal to $\overline{A_{edge}}$), for disabling the B-signal edge detector 146 for the duration $T_{Aedge}$ of each pulse $A_{edge}$. The pulse $A_{edge}$ has an inactive low level equal to $V_C$, an active high level equal to $V_B$, and the predetermined width $T_{Aedge}$, which is at least as long as the longer of the desired rise time and fall time of the signal B. For example, $T_{Aedge}$ may be in a range of 1-200 ns.

The DDHSDPE circuit 138 receives the supply voltages $V_A$, $V_B$, and $V_C$, and is operable to generate $HDS_A$, and thus is operable to enable the high-drive-strength buffer 152, in response to the pulse $A_{edge}$. Although $HDS_A$ is shown as having the same width $T_{Aedge}$ as $A_{edge}$, $HDS_A$ may have a different width than $A_{edge}$. Furthermore, although $DISABLE_B$ is shown as having the same width as $HDS_A$, $DISABLE_B$ may have a different width than $HDS_A$.

Still referring to FIGS. 9-10, the operation of the step-up translator 126 is described according to an embodiment of the invention.

While $E_A$ and $E_B$ have inactive low levels (e.g., $E_A=E_B=E_{Alow}=E_{Blow}=V_C$), then the input buffer 130 isolates the node 150 from the signal A on the node 122, and the multiplexer 154 isolates the signal B on the node 124 from the node 150. As described above, the multiplexer 154 couples the node 124 to the input of the buffer 156, such that the multiplexer and the buffer form a weak latch that reinforces the level ($B_{high}$ or $B_{low}$) of the signal B on the node 124.

Furthermore, the input buffer 130 may generate a default level ($B_{low}$ or $B_{high}$) for $A_{translated}$ to prevent the node 150 from electrically floating, and may generate a corresponding default level ($A_{low}$ or $A_{high}$) for $A_{buf}$ to prevent the node 148 from electrically floating.

Next, $E_A$ and $E_B$ transition to active high levels (e.g., $E_A=E_{Ahigh}=V_A$ and $E_B=E_{Bhigh}=V_B$).

If the logic level of signal A is the same as the default logic levels of $A_{translated}$ and $A_{buf}$, then the input buffer 130 maintains the default voltage level (either $B_{high}=V_B$ or $B_{low}=V_C$) on the node 150, and the multiplexer 154 couples this voltage level to the input of the buffer 156, which drives this voltage level onto the node 124 as the signal B. Because there is no transition of the signal A, the edge detector 136 does not generate $A_{edge}$, and thus the DDHSDPE circuit 138 does not activate the high-drive-strength buffer 152.

But if the logic level of the signal A is different than the default logic levels of $A_{translated}$ and $A_{buf}$ when $E_A$ and $E_B$ transition to $E_{Ahigh}$ and $E_{Bhigh}$, respectively, or if A transitions to a logic level other than the default logic level while $E_A=E_{Ahigh}$ and $E_B=E_{Bhigh}$, then the input buffer 130 transitions the voltage levels on the nodes 148 and 150.

For example, suppose that a low logic level is the default logic level of $A_{translated}$ and $A_{buf}$ and that $A=A_{high}=V_A$ or transitions to $V_A$ shortly after $E_A$ and $E_B$ transition to $E_{Ahigh}$ and $E_{Bhigh}$, respectively. Therefore, the input buffer 130 transitions the voltage level on the node 148 from $A_{low}=V_C$ to $A_{high}=V_A$, and transitions the voltage level on the node 150 from $B_{low}=V_C$ to $B_{high}=V_B$ as shown in FIG. 10 at, e.g., time $t_0$.

In response to the transition of $A_{buf}$ from $A_{low}=V_C$ to $A_{high}=V_A$, the A-signal edge detector 136 generates the pulse $A_{edge}$ for the duration $T_{Aedge}$ as shown in FIG. 10 at, e.g., time $t_0$. The edge detector 136 also generates the pulse $DISABLE_B=\overline{A_{edge}}$ (i.e., $DISABLE_B$ has an active low level $B_{low}=V_C$), to deactivate the B-signal edge detector 146 for the duration $T_{Aedge}$.

In response to the rising edge of the pulse $A_{edge}$, the DDHSDPE circuit 138 generates the pulse $HDS_A$ for a time equal to or greater than $T_{Aedge}$.

In response to the rising edge of $HDS_A$, the high-drive-strength buffer 152 drives $B=B_{high}=V_B$ onto the node 124 with a high drive strength.

At the same time that the high-drive-strength buffer 152 is driving $B_{high}$ onto the node 124 with a relatively high drive strength, the multiplexer 154 is coupling $A_{translated}=B_{high}$ to the buffer 156, which drives $B_{high}$ onto the node 124 with a relatively low drive strength.

But because both the buffers 152 and 156 are active, the step-up translator 126 drives the node 124 with an over all high drive strength.

After the elapse of a time equal to $T_{Aedge}$, the A-signal edge detector 136 transitions $A_{edge}$ back to an inactive logic level $A_{low}=V_C$ as shown in FIG. 10 at, e.g., time $t_1$, and the DDHSDPE circuit 138 transitions $HDS_A$ back to an inactive logic level $B_{low}=V_C$ to deactivate the high-drive-strength buffer 152. The A-signal edge detector 136 also transitions $DISABLE_B$ to an inactive level $B_{high}=V_B$ to re-enable the B-signal edge detector 146.

The multiplexer 154 and the low-drive-strength buffer 156, however, continue to maintain $B=B_{high}=V_B$ on the node 124.

Still referring to FIGS. 9-10, if the master circuit 14 (FIG. 1) subsequently transitions A from $A_{high}$ back to $A_{low}$ (or transitions $E_A$ to $E_{Alow}$ and $E_B$ to $E_{Blow}$) after the elapse of $T_{Aedge}$ (e.g., at time $t_2$), then the step-up translator 126 operates in a manner similar to that described above to drive $B_{low}$ onto the node 124, and continues to operate accordingly for subsequent transitions of A.

Figure 11:
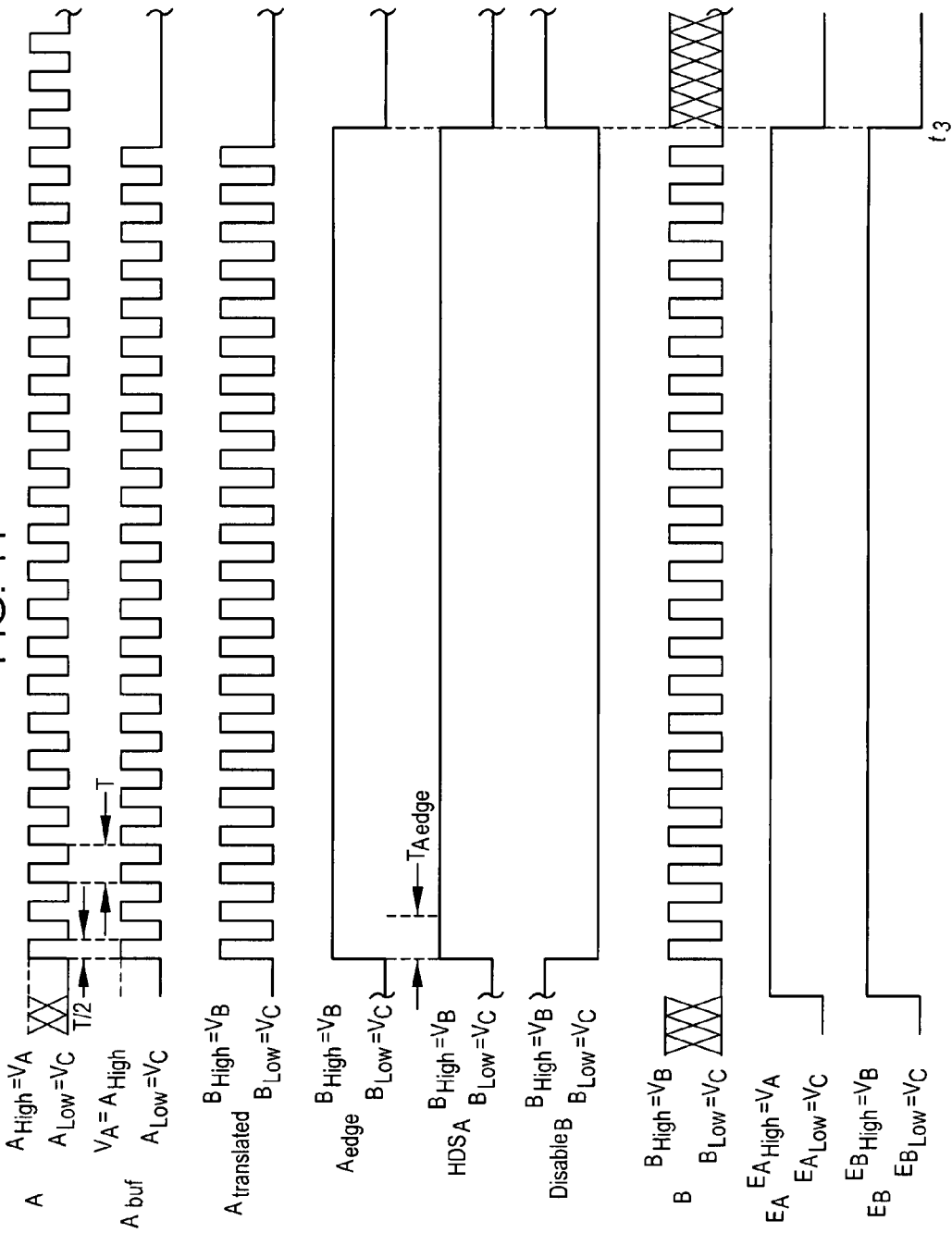
FIG. 11 is a timing diagram of the signals in FIG. 10 according to another embodiment of the invention.

FIG. 11 is a timing diagram of the signals in FIG. 10 according to another embodiment of the invention, where the half period $T_A/2$ of the signal A is less than the width $T_{Aedge}$ of the pulse $A_{edge}$.

Referring to FIGS. 9 and 11, if the master circuit 14 transitions A with a half period $T_A/2 \leq T_{Aedge}$, then the step-up translator 126 transitions B with a higher bandwidth than if $T_A/2 > T_{Aedge}$. As long as $T_A/2 \leq T_{Aedge}$, the pulses $A_{edge}$ effectively overlap such that $A_{edge}$ is at a constant active high logic level $B_{high}=V_B$. Consequently, the DDHSDP circuit 138 generates $HDS_A$ at a constant active logic level $B_{high}=V_B$ such that the high-drive-strength buffer 152 remains enabled as long as $T_A/2 \leq T_{Aedge}$. That is, the buffer 152 is able to drive transitions of the signal B onto the node 124 substantially immediately, without "waiting" for the following sequence of actions: for the edge detector 136 to generate $A_{edge}$ in response to the transition of $A_{buf}$, for the DDHSDP circuit 138 to generate $HDS_A$ in response to $A_{edge}$, and for the buffer 152 itself to become enabled in response to $HDS_A$. So for a sequence of A transitions where the half period $T_A/2 \leq T_{Aedge}$, the high-drive-strength buffer 152 is continuously enabled so that the step-up translator converts A into B with a bandwidth that is higher than the bandwidth would be if the buffer 152 were enabled and disabled for every transition of a the signal A, as occurs when $T_A/2 > T_{Aedge}$.

Referring to FIGS. 9-11, when $E_A$ and $E_B$ subsequently transition to an inactive low level $V_C$ at time $t_3$, the buffer 130 drives the signals $A_{buf}$ and $A_{translated}$ to their respective default levels (here low logic level $V_C$), the A-signal edge detector 136 drives the signal $DISABLE_B$ to its default level (here high logic level $V_B$), and the multiplexer 154 uncouples the node 150 from the node 124 and couples the node 124 to the input of the weak buffer 156.

Still, referring to FIGS. 9-11, the topology of the step-down translator 128 is discussed according to an embodiment of the invention. In this embodiment, the signals B, $B_{buf}$, $B_{translated}$, $B_{edge}$, $HDS_B$, $DISABLE_A$, and A respectively have the same timing as the signals A, $A_{buf}$, $A_{translated}$, $A_{edge}$, $HDS_A$, $DISABLE_B$, and B as shown in FIGS. 10-11, but have the following different voltage levels: $B_{buf} \rightarrow V_B$ and $V_C$, and $B_{translated}$, $B_{edge}$, $HDS_B$, and $DISABLE_A \rightarrow V_A$ and $V_C$.

Referring to FIGS. 9-10, the input buffer 140 of the step-up translator 128 receives the supply voltages $V_A$, $V_B$, and $V_C$, and is operable to receive the signals B and $E_B$ generated by the selected slave circuit 16 (FIG. 1), convert B into a corresponding signal $B_{buf}$ on a node 158, and convert B into a corresponding signal $B_{translated}$ on a node 160. The signal $B_{buf}$ has the same voltage level as the signal B, and thus is a buffered version of the signal B. The signal $B_{translated}$ has the same voltage level as a corresponding signal A would have. For example, if $B=B_{high}=V_B$, then $B_{translated}=A_{high}=V_A$; similarly, if $B=B_{low}=V_C$, then $B_{translated}=A_{low}=V_C$.

The high-drive-strength signal path 142 includes a high-drive-strength buffer 162, which receives the supply voltages $V_A$ and $V_C$ and which and is operable to convert the signal $B_{translated}$ on the node 160 into a corresponding signal A on the node 122 in response to a high-drive-strength enable signal $HDS_B$ from the DDHSDPE circuit 138. For example, if $B_{translated}=V_C$, then the buffer 162 converts $B_{translated}$ into $A=V_C=A_{low}$. Similarly, if $B_{translated}=V_A$, then the buffer 162 converts $B_{translated}$ into $A=V_A=A_{high}$. The buffer 162 drives the signal A onto the node 122 with a relatively high drive strength for the duration of the signal $HDS_B$ such that the signal A has a rise/fall time within a desired range. Similar to the signal $HDS_A$, the signal $HDS_B$ has a duration that is at least as long as the desired rise/fall time of the signal A (e.g., 1-100 ns). Furthermore, the buffer 162 may be designed to make the rise time of A faster than the fall time of A, or vice versa.

The low-drive-strength signal path 144 includes a multiplexer 164 and a buffer 166, which both receive the supply voltages $V_A$ and $V_C$.

In response to $E_A$ having an active high level $V_A$, the multiplexer 164 couples $B_{translated}$ on the node 160 to the buffer 166, which drives $B_{translated}$ onto the node 122 as the signal A with a relatively low drive strength. While $HDS_B$ and $E_A$ are active, both the buffers 162 and 166 drive the signal $A=B_{translated}$ onto the node 122, such that the drive strength of the step-up translator 128 is high. But after $HDS_B$ returns to an inactive level, only the buffer 166 drives the signal A onto the node 122; consequently, the drive strength of the step-up translator 128 is low. This low drive strength allows the buffer 162 to thereafter transition A in response to the selected slave circuit 16 (FIG. 1) transitioning B, and allows the master circuit 14 (FIG. 1) to thereafter transition A, without the interface 12 consuming an excessive amount of power.

Conversely, in response to $E_A$ having an inactive low level $V_C$, the multiplexer 164 couples the node 122 to the buffer 166; consequently, the multiplexer and the buffer form a weak latch that isolates the node 122 from the node 124 and that reinforces the level ($A_{high}$ or $A_{low}$) of the signal A on the node 122.

The B-signal edge detector 146 receives the supply voltages $V_A$, $V_B$, and $V_C$, is operable to generate a pulse $B_{edge}$ in response to each transition of the signal B from $B_{low}$ to $B_{high}$ and in response to each transition of B from $B_{high}$ to $B_{low}$, and is operable to generate a signal $DISABLE_A$ (which is equal to $\overline{B_{edge}}$) for disabling the A-signal edge detector 136 for the duration $T_{Bedge}$ of each pulse $B_{edge}$.

The DDHSDPE circuit 138 is operable to generate $HDS_B$, and thus is operable to enable the high-drive-strength buffer 162, in response to the pulse $B_{edge}$. $HDS_B$ may have the same width $T_{Bedge}$ as $B_{edge}$, or $HDS_B$ may have a different pulse width, and $DISABLE_A$ may have the same or a different pulse width than $HDS_B$.

Referring to FIGS. 9-10, the operation of the step-down translator 128 is described according to an embodiment of the invention.

While $E_A$ and $E_B$ have inactive low levels (e.g., $E_A=E_B=E_{Alow}=E_{Blow}=V_C$), then the input buffer 140 isolates the node 160 from the signal B on the node 124, and the multiplexer 164 isolates the signal A on the node 122 from the node 160. As described above, the multiplexer 164 couples the node 122 to the input of the buffer 166, such that the multiplexer and the buffer form a weak latch that reinforces the level ($A_{high}$ or $A_{low}$) of the signal A on the node 122. Furthermore, the input buffer 140 may generate a default level ($A_{low}$ or $A_{high}$) for $B_{translated}$ to prevent the node 160 from electrically floating, and may generate a corresponding default level ($B_{low}$ or $B_{high}$) for $B_{buf}$ to prevent the node 158 from electrically floating.

Next, $E_A$ and $E_B$ transition to active high levels (e.g., $E_A=E_{Ahigh}=V_A$ and $E_B=E_{Bhigh}=V_B$).

If the logic level of signal B is the same as the default logic levels of $B_{translated}$ and $B_{buf}$, then the input buffer 140 maintains the default voltage level (either $A_{high}=V_A$ or $A_{low}=V_C$) on the node 160, and the multiplexer 164 couples this voltage level to the input of the buffer 166, which drives this voltage level onto the node 122 as the signal A. Because there is no transition of the signal B, the edge detector 146 does not generate $B_{edge}$, and thus the DDHSDPE circuit 138 does not activate the high-drive-strength buffer 162.

But if the logic level of the signal B is different than the default logic levels of $B_{translated}$ and $B_{buf}$, or if B transitions to this different logic level, then the input buffer 140 transitions the voltage level on the nodes 158 and 160. For example, suppose that a low logic level is the default logic level of both $B_{translated}$ and $B_{buf}$ and that $B=B_{high}=V_B$. Therefore, the input buffer 140 transitions the voltage level on the node 158 from $B_{low}=V_C$ to $B_{high}=V_B$, and transitions the voltage level on the node 160 from $A_{low}=V_C$ to $A_{high}=V_A$ (corresponds, e.g., to time $t_0$ in FIG. 10).

In response to the transition of $B_{buf}$ from $B_{low}=V_C$ to $B_{high}=V_B$, the B-signal edge detector 146 generates the pulse $B_{edge}$ for the duration $T_{Bedge}$ (corresponds, e.g., to time $t_0$ in FIG. 10). The edge detector 146 also generates the pulse $DISABLE_A=\overline{B_{edge}}$ (i.e., $DISABLE_A$ has an active low level $A_{low}=V_C$), to deactivate the A-signal edge detector 136 for the duration $T_{Bedge}$.

In response to the rising edge of the pulse $B_{edge}$, the DDHSDPE circuit 138 generates the pulse $HDS_B$ for a time equal to or greater than $T_{Bedge}$.

In response to the rising edge of $HDS_B$, the high-drive-strength buffer 162 drives $A_{high}=V_A$ onto the node 122 with a high drive strength.

At the same time that the high-drive-strength buffer 162 is driving $A_{high}$ onto the node 122 with a relatively high drive strength, the multiplexer 164 is coupling $B_{translated}=A_{high}$ to the buffer 166, which drives $A_{high}$ onto the node 122 with a relatively low drive strength.

But because both the buffers 162 and 166 are active, the step-down translator 128 drives the node 122 with an over all high drive strength.

After the elapse of a time equal to $T_{Bedge}$, the B-signal edge detector 146 transitions $B_{edge}$ back to $B_{low}=V_C$ (corresponds, e.g., to time $t_1$ of FIG. 10) and the DDHSDPE circuit 138 transitions $HDS_B$ back to an inactive level $A_{low}=V_C$ (e.g., time $t_1$) to deactivate the high-drive-strength buffer 162. The B-signal edge detector 146 also transitions $DISABLE_A$ to an inactive level $A_{high}=V_A$ to re-enable the A-signal edge detector 136 (e.g., time $t_1$).

The multiplexer 164 and the low-drive-strength buffer 166, however, continue to maintain $A=A_{high}=V_A$ on the node 122.

Still referring to FIGS. 9-10, if the selected slave circuit 16 (FIG. 1) subsequently transitions B from $B_{high}$ back to $B_{low}$ (or transitions $E_A$ to $E_{Alow}$ and $E_B$ to $E_{Blow}$) after the elapse of $T_{Bedge}$ corresponding (e.g., to time $t_2$ in FIG. 10), then the step-down translator 128 operates in a manner similar to that described above to drive $A_{low}$ onto the node 122, and continues to operate accordingly for subsequent transitions of B.

Referring to FIGS. 9 and 11, if the selected slave circuit 16 transitions B with a half period $T_B/2 \leq T_{Bedge}$, then the step-down translator 128 transitions A with a higher bandwidth than if $T_B/2 > T_{Bedge}$ for reasons similar to those described above in conjunction with FIGS. 9 and 11 for the set-up translator 126.

Referring to FIGS. 9-11, when $E_A$ and $E_B$ subsequently transition to an inactive low level $V_C$ (corresponds to time $t_3$ in FIGS. 10-11), the input buffer 140 drives the signals $B_{buf}$ and $B_{translated}$ to their respective default levels (here low logic level $V_C$), the B-signal edge detector 146 drives the signal $DISABLE_A$ to its default level (here high logic level $V_A$), and the multiplexer 164 uncouples the node 160 from the node 122 and couples the node 122 to the input of the weak buffer 166.

Referring to FIG. 9, alternate embodiments of the coupling circuit 120 are contemplated. For example, $V_C$ may be other than ground, and $V_A$ and $V_B$ may be negative, and, thus, less than $V_C$.

Figure 12:
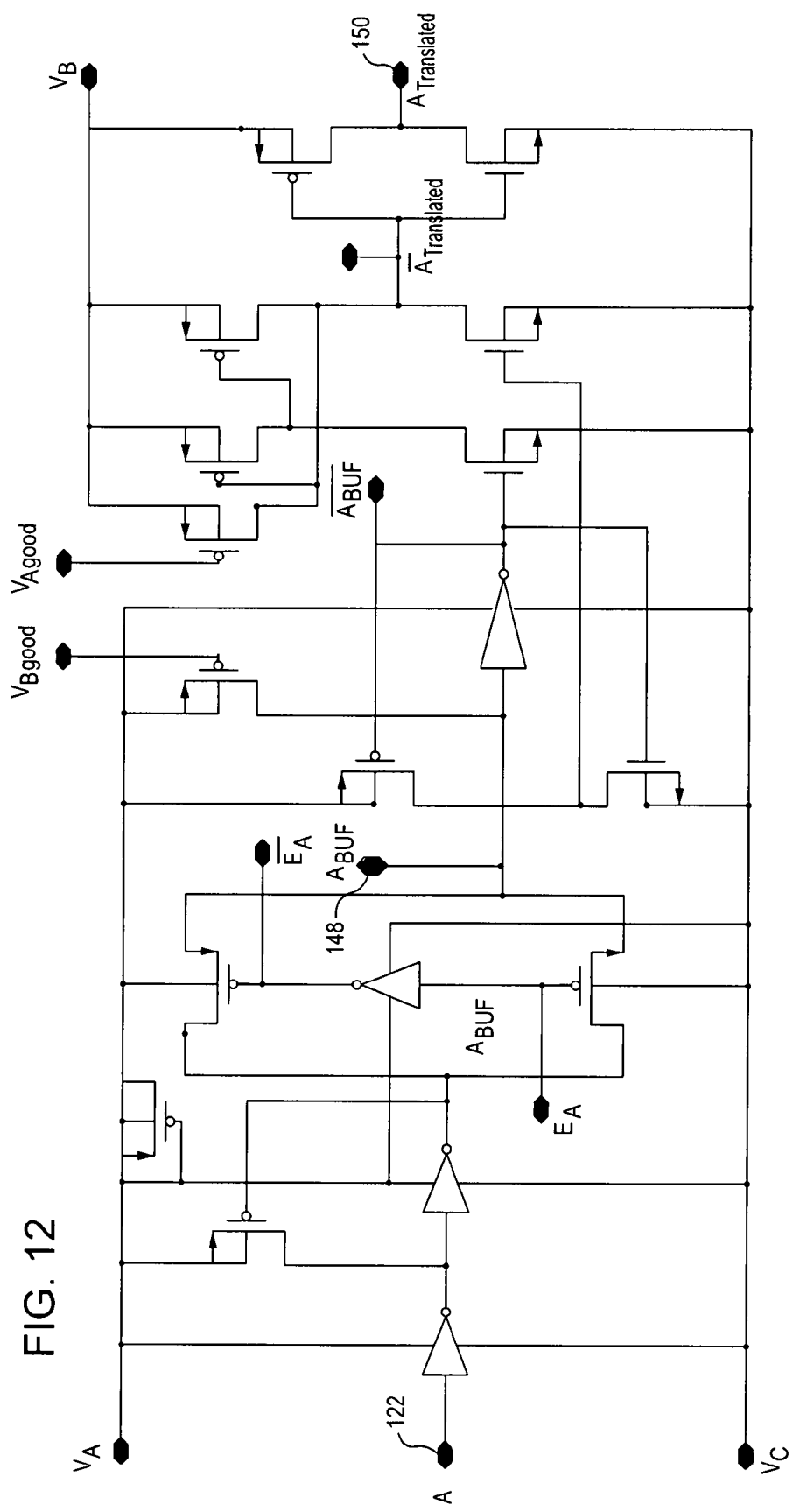
FIG. 12 is a schematic diagram of the low-voltage-to-high-voltage input buffer of FIG. 9 according to an embodiment of the invention.

FIG. 12 is a schematic diagram of the input buffer 130 of FIG. 9 according to an embodiment of the invention. During power up of the coupling circuit 120 (FIG. 9), power-supply-detection circuitry (not shown in FIG. 11) generates $V_{Agood}=V_C$ while $V_A$ is less than a predetermined $V_A$ threshold, and then transitions $V_{Agood}$ to $V_B$ when $V_A$ equals or is greater than the threshold. Similarly, the power-supply-detection circuitry generates $V_{Bgood}=V_C$ while $V_B$ is less than a predetermined $V_B$ threshold, and then transitions $V_{Bgood}$ to $V_A$ when $V_B$ equals or is greater than the $V_B$ threshold. For example, if $V_A$ steady state=1.8 V and $V_B$ steady state=2.7 V, then the predetermined $V_A$ threshold may equal 1.6 V and the predetermined $V_B$ threshold may equal 2.4 V. Furthermore, the circuit 80 (FIG. 5) may generate $\overline{E_A}$ in addition to generating $E_A$. Moreover, $\overline{A_{tranlsated}}$ may be coupled to the node 150 if the high-drive-strength buffer 152 (FIG. 9) is an inverting buffer; similarly, $\overline{A_{buf}}$ may be coupled to the node 148 if the A-signal edge detector 136 (FIG. 9) is designed to accept the complement of $A_{buf}$. In addition, if $V_A$ and $V_B$ are negative relative to $V_C$, then one may replace the input buffer 130 with its dual.

Still referring to FIG. 12, the input buffer 140 is similar to the input buffer 130 according to an embodiment of the invention. Specifically, the input buffer 140 is similar to the input buffer 130 but with the following changes: the nodes 124, 158, and 160 of the buffer 140 (FIG. 9) are respectively located where the nodes 122, 148, and 150 of the buffer 130 are located in FIG. 12, $V_A$ of the buffer 140 is coupled to the node where $V_B$ is coupled in FIG. 12, $V_B$ is coupled to the node where $V_A$ is coupled in FIG. 12, $E_B$ and $\overline{E_B}$ are respectively coupled to the nodes where $E_A$ and $\overline{E_A}$ are coupled in FIG. 12, $B_{buf}$ and $\overline{B_{buf}}$ are respectively generated on the nodes on which $A_{buf}$ and $\overline{A_{buf}}$ are generated in FIG. 12, $B_{translated}$ and $\overline{B_{translated}}$ are respectively generated on the nodes on which $A_{translated}$ and $\overline{A_{translated}}$ are generated in FIG. 12, $V_{Agood}$ is coupled to the node where $V_{Bgood}$ is coupled in FIG. 12, and $V_{Bgood}$ is coupled to the node where $V_{Agood}$ is coupled in FIG. 12. Furthermore, if $V_A$ and $V_B$ are negative relative to $V_C$, then one may replace the input buffer 140 with its dual.

Figure 13:
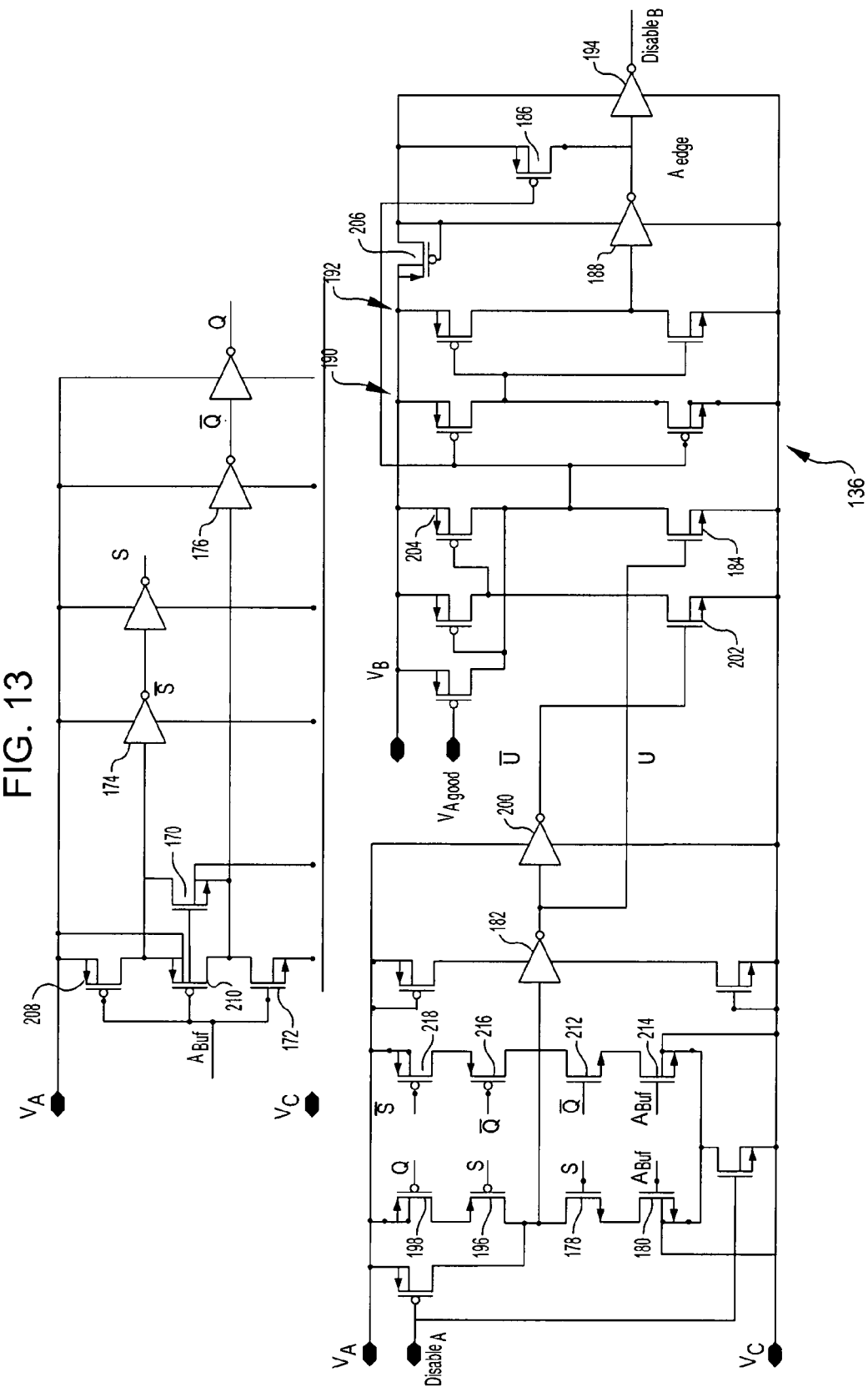
FIG. 13 is a schematic diagram of the low-voltage edge detector of FIG. 9 according to an embodiment of the invention.

FIG. 13 is a schematic diagram of the A-signal edge detector 136 of FIG. 9 according to an embodiment of the invention. Although not shown in FIG. 9, the input buffer 130 may provide $\overline{A_{buf}}$ to the edge detector 136 as discussed above in conjunction with FIG. 12. Furthermore, the edge detector 136 receives $V_{Agood}$ from the power-supply-detection circuitry (not shown in FIG. 13) as discussed above in conjunction with FIG. 12.

Figure 14:
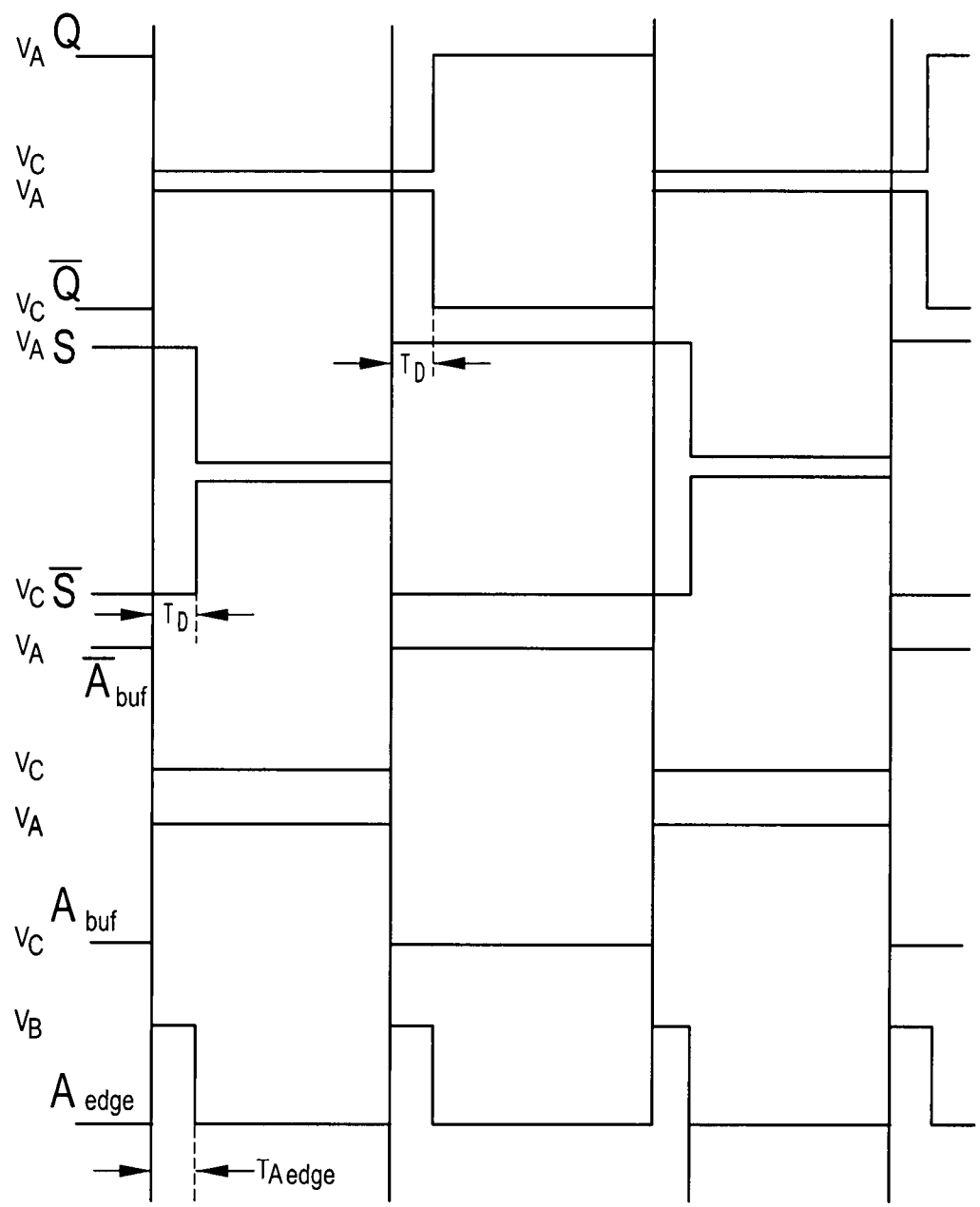
FIG. 14 is a timing diagram of signals in FIG. 13 according to an embodiment of the invention.

FIG. 14 is a timing diagram of some of the signals in FIG. 13 according to an embodiment of the invention. Although for clarity these signals are shown having zero rise and fall times, it is understood that these signals have nonzero rise and fall times. Furthermore, although for clarity the edges of some of these signals are shown as being contemporaneous with the edges of other of these signals, it is understood that the edges of different signals may be delayed from one another in time.

Referring to FIGS. 13-14, in response to a transition of $A_{buf}$ from $A_{low}=V_C$ to $A_{high}=V_A$, NMOS transistors 170 and 172 respectively pull down the inputs of inverters 174 and 176, thus causing the signals S, $\overline{S}$, Q, and $\overline{Q}$ to transition.

But because the transistor 172 is weaker (i.e., has a higher resistance) than the transistor 170, the transitions of the signals S and $\overline{S}$ are delayed by a predetermined time $T_D$ ($T_D$ may be less than or approximately equal to $T_{Aedge}$) relative to the signals Q and $\overline{Q}$.

For this predetermined delay time $T_D$, both S and $A_{buf}$ are at a high level $V_A$, and thus cause NMOS transistors 178 and 180 to pull down the input of an inverter 182 to $V_C$, which causes the inverter 182 to transition an intermediate signal U to a high level $V_A$.

In response to this low-to-high transition of U, an NMOS transistor 184 pulls the gate of a PMOS transistor 186 down to $V_C$, and thus causes the transistor 186 to transition $A_{edge}$ to a high level $V_B$. Therefore, the propagation delay between the rising edge of U and the rising edge of $A_{edge}$ is equal to the delay through the transistors 184 and 186. Furthermore, an inverter 188 reinforces the high logic level of $A_{edge}$ after the low-to-high transition of U propagates through the transistor 184, inverters 190 and 192, and the inverter 188.

In response to the low-to-high transition of $A_{edge}$, an inverter 194 transitions $DISABLE_B$ to an active logic low level $V_C$ to disable the B-signal edge detector 146 (FIG. 9).

After the elapse of the predetermined delay time $T_D$, S transitions to a low logic level $V_C$, thus turning off the transistor 178 and turning on a PMOS transistor 196.

Because the signal Q is at a high logic level $V_A$, a PMOS transistor 198 is also on.

Consequently, the transistors 196 and 198 pull up the input of the inverter 182 to a high level $V_A$, and thus cause the inverter 182 to transition U to a low level $V_C$ and an inverter 200 to transition $\overline{U}$ to a high level $V_A$.

After propagating through transistors 202 and 204 and inverters 190, 192, and 188, $\overline{U}$ causes the inverter 188 to transition $A_{edge}$ back to a low level $V_C$. Furthermore, the transition of $A_{edge}$ back to $V_C$ causes the inverter 194 to transition $DISABLE_B$ back to an inactive high level $V_B$.

Therefore, $T_{Aedge}$ is a function of the delay $T_D$, the propagation delay of the rising edge of U through the transistors 184 and 186, and the propagation delay of the rising edge of $\overline{U}$ (equivalent to the falling edge of U) through the transistors 202 and 204 and the inverters 190, 192, and 188. Furthermore, the dimensions of a transistor 206 may be set to finely adjust $T_{Aedge}$.

Still referring to FIGS. 13-14, in response to a transition of $A_{buf}$ from $A_{high} = V_A$ to $A_{low} = V_C$, PMOS transistors 208 and 210 respectively pull up the inputs of inverters 174 and 176, thus causing the signals S, $\overline{S}$, Q, and $\overline{Q}$ to transition.

But because the transistor 210 is weaker (i.e., has a higher resistance) than the transistor 208, the transitions of the signals Q and $\overline{Q}$ are delayed by $T_D$ relative to the signals S and $\overline{S}$.

For the delay time $T_D$, both $\overline{Q}$ and $\overline{A_{buf}}$ are at a high level $V_A$, and thus cause NMOS transistors 212 and 214 to pull down the input of the inverter 182 to $V_C$, which causes the inverter 182 to transition the intermediate signal U to a high level $V_A$.

In response to this low-to-high transition of U, the NMOS transistor 184 and PMOS transistor 186 transition Aedge to a high level $V_B$ as discussed above. Furthermore, the inverter 194 transitions $DISABLE_B$ to an active low level $V_C$, and the inverter 188 subsequently reinforces the high logic level of Aedge, as described above.

After the elapse of the delay time $T_D$, $\overline{Q}$ transitions to a low logic level $V_C$, thus turning off the transistor 212 and turning on a PMOS transistor 216.

Because the signal $\overline{S}$ is also at a high logic level $V_A$, a PMOS transistor 218 is also on.

Consequently, the transistors 216 and 218 pull up the input of the inverter 182 to a high level $V_A$, and thus cause the inverter 182 to transition U to a low level $V_C$ and the inverter 200 to transition $\overline{U}$ to a high level $V_A$.

As described above, the transition of $\overline{U}$ to $V_A$ causes the inverter 188 to transition $A_{edge}$ back to an inactive low level $V_C$, and this transition of $A_{edge}$ causes the inverter 194 to transition $DISABLE_B$ back to inactive high level $V_B$.

Alternative embodiments of the signal-A edge detector 136 are contemplated. For example, the delay $T_D$ may be significantly shorter than $T_{Aedge}$. Furthermore, if $V_A$ and $V_{Bn}$ are negative relative to $V_C$, then one may replace the signal-A edge detector 136 with its dual.

Still referring to FIGS. 13-14, the signal-B edge detector 146 (FIG. 9) is similar to the edge detector 136 according to an embodiment of the invention. Specifically, the edge detector 146 is similar to the edge detector 136 but with the following changes: the signals $B_{buf}$ and $\overline{B_{buf}}$ of the detector 146 are respectively coupled to the nodes to which $A_{buf}$ and $\overline{A_{buf}}$ are coupled in FIG. 13, $V_A$ of the edge detector 146 is coupled to the node where $V_B$ is coupled in FIG. 13, $V_B$ is coupled to the node where $V_A$ is coupled in FIG. 13, $DISABLE_A$ and $DISABLE_B$ are respectively coupled to the nodes where $DISABLE_B$ and $DISABLE_A$ are coupled in FIG. 13, and $V_{Bgood}$ is coupled to the node where $V_{Agood}$ is coupled in FIG. 13. Furthermore, if $V_A$ and $V_B$ are negative relative to $V_C$, then one may replace the edge detector 146 with its dual.

Figure 15:
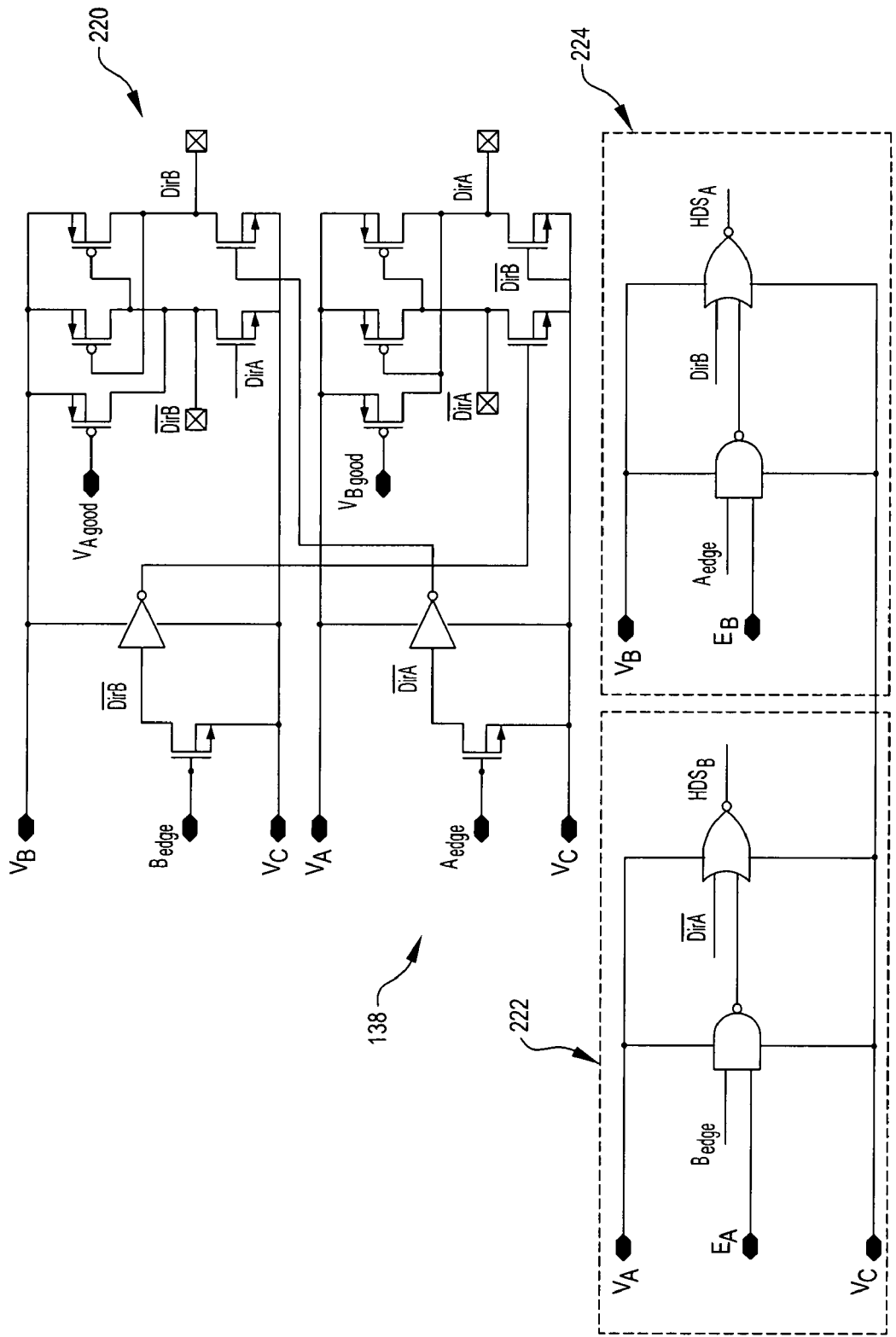
FIG. 15 is a schematic diagram of the direction-detector-and-high-drive-strength-path-enable (DDHDSPE) circuit of FIG. 9 according to an embodiment of the invention.

FIG. 15 is a schematic diagram of the DDHSDPE circuit 138 according to an embodiment of the invention. The circuit 138 includes a first circuit 220, a second circuit 222, and a third circuit 224.

The first circuit 220 generates signals $DIR_A$, $\overline{DIR_A}$, $DIR_B$, and $\overline{DIR_B}$ having respective first values when the master circuit 14 (FIG. 1) generates a signal A on the node 122 (FIG. 9) for coupling to the node 124 (FIG. 9) as the signal B, and generates $DIR_A$, $\overline{DIR_A}$, $DIR_B$, and $\overline{DIR_B}$ having respective second values when the selected slave circuit 16 (FIG. 1) generates a signal B on the node 124 for coupling to the node 122 as the signal A. Specifically, the first circuit 220 generates signals $DIR_A = DIR_B = V_C$, $\overline{DIR_A} = V_A$, and $\overline{DIR_B} = V_B$ while $A_{edge} = V_A$ and $B_{edge} = V_C$; conversely, the first circuit generates $\overline{DIR_A} = \overline{DIR_B} = V_C$, $DIR_A = V_A$, and $DIR_B = V_B$ while $A_{edge} = V_C$ and $B_{edge} = V_B$.

A second circuit 222 generates the pulse $HDS_B$ while $B_{edge} = E_A = V_A$ and $\overline{DIR_A} = V_C$. Therefore, as discussed above in conjunction with FIGS. 9-11, the pulse $HDS_B$ has approximately the same duration $T_{Bedge}$ as the pulse $B_{edge}$ in this embodiment (unless $E_A$ transitions to $V_C$ before Bedge transitions to $V_C$).

Similarly, a third circuit 224 generates the pulse $HDS_A$ while $A_{edge} = E_B = V_B$ and $DIR_B = V_C$. Therefore, the pulse $HDS_A$ has approximately the same duration $T_{Aedge}$ as the pulse $A_{edge}$ in this embodiment (unless $E_B$ transitions to $V_C$ before $A_{edge}$ transitions to $V_C$).

Alternative embodiments of the DDHSDPE circuit 138 are contemplated. For example, if $V_A$ and $V_B$ are negative relative to $V_C$, then one may replace the circuit 138 with its dual.

Figure 16:
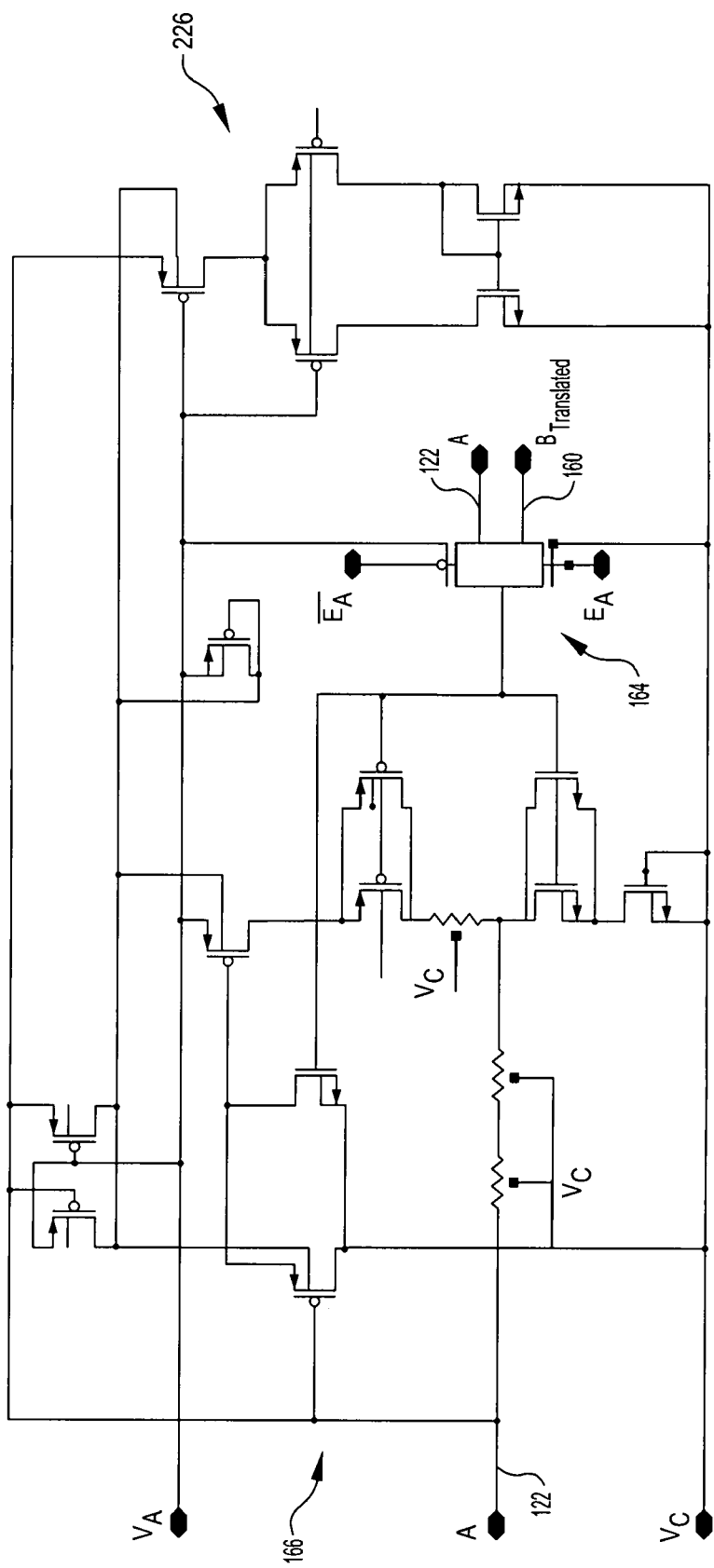
FIG. 16 is a schematic diagram of the high-voltage-to-low-voltage multiplexer and hold buffer of FIG. 9 according to an embodiment of the invention.

FIG. 16 is a schematic diagram of the multiplexer 164 and the weak buffer 166 of FIG. 9, and of an over-current-protection circuit 226 according to an embodiment of the invention. An inverter (not shown in FIG. 15) may generate $\overline{E_A}$ from $E_A$.

Alternative embodiments of the multiplexer 164, buffer 166, and protection circuit 226 are contemplated. For example, if $V_A$ and $V_B$ are negative relative to $V_C$, then one may replace the circuits 164, 166, and 226 with their respective duals.

Still referring to FIG. 16, the multiplexer 154 and buffer 156 of FIG. 9 and a corresponding over-current protection circuit (not shown in FIG. 9) are respectively similar to the multiplexer 164, buffer 166, edge detector 136 according to an embodiment of the invention. Specifically, the multiplexer 154, buffer 156, and corresponding over-current-protection circuit are similar to the multiplexer 164, the buffer 166, and protection circuit 226 but for the following changes: the nodes 124 and 150 (FIG. 9) are respectively located where the nodes 122 and 160 are located in FIG. 16, signals $E_B$ and $\overline{E_B}$ are respectively coupled to the nodes to which $E_A$ and $\overline{E_A}$ are coupled in FIG. 16, and $V_B$ is coupled to the node where $V_A$ is coupled in FIG. 16. Furthermore, if $V_A$ and $V_B$ are negative relative to $V_C$, then one may replace the multiplexer 154, the buffer 156, and the corresponding over-current-protection circuit with their duals.

The preceding discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

What is claimed is:

1. A bidirectional signal interface, comprising:
a first node operable to receive a first logic signal;
a second node operable to receive a second logic signal;
a first translating circuit having a first signal path coupled between the first and second nodes, operable to receive an enable signal, operable to sense a transition of the first logic signal on the first node, and, in response to the enable signal and the transition, operable to couple the first logic signal to the second node via the first signal path; and
a second translating circuit having a second signal path coupled between the first and second nodes in parallel to the first signal path, the second translating circuit operable to receive the enable signal, operable to sense a transition of the second logic signal on the second node, and, in response to the enable signal and the transition of the second logic signal, operable to couple the second logic signal to the first node via the second signal path.

2. The bidirectional signal interface of claim 1 wherein:
the first logic signal is operable to transition between first and second voltage levels; and
the second logic signal is operable to transition between the first voltage level and a third voltage level that is different than the first voltage level.

3. A bidirectional signal interface, comprising:
a first node operable to receive a first logic signal;
a second node operable to receive a second logic signal;
a first translating circuit having a first signal path coupled between the first and second nodes, operable to sense a transition of the first logic signal on the first node, and, in response to the transition, operable to couple the first logic signal to the second node via the first signal path;
a second translating circuit having a second signal path coupled between the first and second nodes in parallel to the first signal path, the second translating circuit operable to sense a transition of the second logic signal on the second node, and, in response to the transition of the second logic signal, operable to couple the second logic signal to the first node via the second signal path;
wherein the first logic signal is operable to transition between first and second voltage levels;
the second logic signal is operable to transition between the first voltage level and a third voltage level that is different than the first logic level; and
the first and second translating circuits each include a respective first supply node operable to receive a first supply voltage that is substantially equal to the first voltage level, a respective second supply node operable to receive a second supply voltage that is substantially equal to the second voltage level, and a respective third supply node operable to receive a third supply voltage that is substantially equal to the third voltage level.

4. A bidirectional signal interface, comprising:
a first node operable to receive a first logic signal;
a second node operable to receive a second logic signal;
a first translating circuit having a first signal path coupled between the first and second nodes, operable to sense a transition of the first logic signal on the first node, and, in response to the transition, operable to couple the first logic signal to the second node via the first signal path;
a second translating circuit having a second signal path coupled between the first and second nodes in parallel to the first signal path, the second translating circuit operable to sense a transition of the second logic signal on the second node, and, in response to the transition of the second logic signal, operable to couple the second logic signal to the first node via the second signal path;
wherein the first translating circuit is, in response to the transition of the first logic signal, operable to drive the first logic signal onto the second node with a first drive strength during a first predetermined period and with a second drive strength after the elapse of the first predetermined period; and
wherein the second translating circuit is, in response to the transition of the second logic signal, operable to drive the second logic signal onto the first node with a third drive strength during a second predetermined period and with a fourth drive strength after the elapse of the second predetermined period.

5. A bidirectional signal interface, comprising:
a first node operable to receive a first logic signal;
a second node operable to receive a second logic signal;
a first translating circuit having a first signal path coupled between the first and second nodes, operable to sense a transition of the first logic signal on the first node, and, in response to the transition, operable to couple the first logic signal to the second node via the first signal path;
a second translating circuit having a second signal path coupled between the first and second nodes in parallel to the first signal path, the second translating circuit operable to sense a transition of the second logic signal on the second node, and, in response to the transition of the second logic signal, operable to couple the second logic signal to the first node via the second signal path;
wherein the first translating circuit is operable to couple the first logic signal to the second node in response to the first logic signal transitioning from a first voltage level to a second voltage level;
wherein the second translating circuit is operable to couple the second logic signal to the first node in response to the second logic signal transitioning from the first voltage level to a third voltage level that is different from the second voltage level; and
a third translating circuit having a third signal path coupled between the first and second nodes in parallel to the first and second signal paths, the third translating circuit operable couple the first logic signal to the second node while the first logic signal has the first voltage level and operable to couple the second logic signal to the first node while the second logic signal has the first voltage level.

6. A bidirectional signal interface, comprising:
a first node operable to receive a first logic signal;
a second node operable to receive a second logic signal;
a first translating circuit having a first signal path coupled between the first and second nodes, operable to sense a transition of the first logic signal on the first node, and, in response to the transition, operable to couple the first logic signal to the second node via the first signal path;
a second translating circuit having a second signal path coupled between the first and second nodes in parallel to the first signal path, the second translating circuit operable to sense a transition of the second logic signal on the second node, and, in response to the transition of the second logic signal, operable to couple the second logic signal to the first node via the second signal path;
the first translating circuit, in response to the transition of the first logic signal on the first node, is operable to prohibit the second translating circuit from coupling the second logic signal to the first node for a first predetermined time; and
the second translating circuit, in response to the transition of the second logic signal on the second node, is operable to prohibit the first translating circuit from coupling the first logic signal to the second node for a second predetermined time.

7. A bidirectional signal interface, comprising:
a first node operable to receive a first logic signal;
a second node operable to receive a second logic signal;
a first translating circuit having a first signal path coupled between the first and second nodes, operable to sense a transition of the first logic signal on the first node, and, in response to the transition, operable to couple the first logic signal to the second node via the first signal path;
a second translating circuit having a second signal path coupled between the first and second nodes in parallel to the first signal path, the second translating circuit operable to sense a transition of the second logic signal on the second node, and, in response to the transition of the second logic signal, operable to couple the second logic signal to the first node via the second signal path;
wherein the first translating circuit further comprises a third signal path that is between the first and second nodes, the first translating circuit, in response to the transition of the first logic signal, operable to couple the first logic signal to the second node via the first and third signal paths for a first predetermined period and via only the third signal path after the first predetermined period; and
wherein the second translating circuit further comprises a fourth signal path that is between the first and second nodes, the second translating circuit, in response to the transition of the second logic signal, operable to couple the second logic signal to the first node via the second and fourth signal paths for a second predetermined period and via only the fourth signal path after the second predetermined period.

8. A bidirectional signal interface, comprising:
a first node operable to receive a first logic signal;
a second node operable to receive a second logic signal;
a first translating circuit having a first signal path coupled between the first and second nodes, operable to sense a transition of the first logic signal on the first node, and, in response to the transition, operable to couple the first logic signal to the second node via the first signal path;
a second translating circuit having a second signal path coupled between the first and second nodes in parallel to the first signal path, the second translating circuit operable to sense a transition of the second logic signal on the second node, and, in response to the transition of the second logic signal, operable to couple the second logic signal to the first node via the second signal path;
wherein the first translating circuit further comprises a third signal path that is between the first and second nodes and that is parallel to the first signal path, the first translating circuit, in response to the transition of the first logic signal, operable to couple the first logic signal to the second node via the first and third signal paths for a first predetermined period and via only the third signal path after the first predetermined period; and
wherein the second translating circuit further comprises a fourth signal path that is between the first and second nodes and that is parallel to the second signal path, the second translating circuit, in response to the transition of the second logic signal, operable to couple the second logic signal to the first node via the second and fourth signal paths for a second predetermined period and via only the fourth signal path after the second predetermined period.

9. A bidirectional signal interface, comprising:
a first node operable to receive a first logic signal;
a second node operable to receive a second logic signal;
a first translating circuit having a first signal path coupled between the first and second nodes, operable to sense a transition of the first logic signal on the first node, and, in response to the transition, operable to couple the first logic signal to the second node via the first signal path;
a second translating circuit having a second signal path coupled between the first and second nodes in parallel to the first signal path, the second translating circuit operable to sense a transition of the second logic signal on the second node, and, in response to the transition of the second logic signal, operable to couple the second logic signal to the first node via the second signal path;
wherein the first translating circuit further comprises a third signal path that is between the first and second nodes and that is parallel to the first signal path, the first translating circuit, in response to the transition of the first logic signal, operable to drive the first logic signal onto the second node via the first signal path at a first drive strength for a first predetermined time and via the third signal path at a second drive strength after the first predetermined time; and
wherein the second translating circuit further comprises a fourth signal path that is between the first and second nodes and that is parallel to the second signal path, the second translating circuit, in response to the transition of the second logic signal, operable to drive the second logic signal onto the first node via the second signal path at a third drive strength for a second predetermined time and via the fourth signal path at a fourth drive strength after the second predetermined time.

10. A bidirectional signal interface, comprising:
a first node operable to receive a first logic signal;
a second node operable to receive a second logic signal;
a first translating circuit having a first signal path coupled between the first and second nodes, operable to sense a transition of the first logic signal on the first node, and operable in response to the transition to couple the first logic signal to the second node via the first signal path;
a second translating circuit having a second signal path that is coupled between the first and second nodes, operable to sense a transition of the second logic signal on the second node, and operable in response to the transition of the second logic signal to couple the second logic signal to the first node via the second signal path;

wherein the first translating circuit is operable in response to the transition of the first logic signal to disable the second translating circuit from coupling the second logic signal to the first node for a first predetermined time; and wherein the second translating circuit is operable in response to the transition of the second logic signal to disable the first translating circuit from coupling the first logic signal to the second node for a second predetermined time.

11. The bidirectional signal interface circuit of claim 10 wherein the first signal path is parallel to the second signal path.

12. A bidirectional signal interface, comprising:
a first node operable to receive a first logic signal;
a second node operable to receive a second logic signal;
a first translating circuit having a first signal path coupled between the first and second nodes, operable to sense a transition of the first logic signal on the first node, and operable in response to the transition to couple the first logic signal to the second node via the first signal path;
a second translating circuit having a second signal path that is coupled between the first and second nodes, operable to sense a transition of the second logic signal on the second node, and operable in response to the transition of the second logic signal to couple the second logic signal to the first node via the second signal path;
wherein the first translating circuit is operable in response to the transition of the first logic signal to disable the second translating circuit from coupling the second logic signal to the first node for a first predetermined time;
wherein the second translating circuit is operable in response to the transition of the second logic signal to disable the first translating circuit from coupling the first logic signal to the second node for a second predetermined time;
wherein the first translating circuit has a third signal path coupled between the first and second nodes;
wherein the second translating circuit has a fourth signal path coupled between the first and second nodes;
wherein the first translating circuit is operable to couple the first logic signal to the second node via the third signal path; and
wherein the second translating circuit is operable to couple the second logic signal to the first node via the fourth signal path.

13. A bidirectional signal interface, comprising:
a first node operable to receive a first logic signal;
a second node operable to receive a second logic signal;
a first translating circuit having a first signal path coupled between the first and second nodes, operable to sense a transition of the first logic signal on the first node, and operable in response to the transition to couple the first logic signal to the second node via the first signal path;
a second translating circuit having a second signal path that is coupled between the first and second nodes, operable to sense a transition of the second logic signal on the second node, and operable in response to the transition of the second logic signal to couple the second logic signal to the first node via the second signal path;
wherein the first translating circuit is operable in response to the transition of the first logic signal to disable the second translating circuit from coupling the second logic signal to the first node for a first predetermined time;
wherein the second translating circuit is operable in response to the transition of the second logic signal to disable the first translating circuit from coupling the first logic signal to the second node for a second predetermined time;
wherein the first translating circuit has a third signal path that is coupled between the first and second nodes and that is parallel to the first signal path; and
wherein the second translating circuit has a fourth signal path that is coupled between the first and second nodes and that is parallel to the second signal path;
wherein the first translating circuit is operable to couple the first logic signal to the second node via the third signal path; and
wherein the second translating circuit is operable to couple the second logic signal to the first node via the fourth signal path.

14. An electronic system, comprising:
a first integrated circuit having a first signal node and operable to provide a first logic signal on the first signal node;
a second integrated circuit having a second signal node and operable to provide a second logic signal on the second signal node; and
an integrated interface circuit including
a third node coupled to the first signal node,
a fourth node coupled to the second signal node,
a first translating circuit having a first signal path coupled between the third and fourth nodes, operable to sense a transition of the first logic signal on the third node, and, in response to the transition, operable to couple the first logic signal to the fourth node via the first signal path, and
a second translating circuit having a second signal path coupled between the third and fourth nodes in parallel to the first signal path, the second translating circuit operable to sense a transition of the second logic signal on the fourth node, and, in response to the transition of the second logic signal, operable to couple the second logic signal to the third node via the second signal path;
wherein the first integrated circuit further comprises a first enable node and is operable to generate an enable signal on the enable node;
wherein the integrated interface circuit includes a second enable node coupled to the first enable node;
wherein the first translation circuit is operable to couple the first logic signal to the fourth node in response to the enable signal; and
wherein the second translation circuit is operable to couple the second logic signal to the third node in response to the enable signal.

15. The electronic system of claim 14 wherein:
the first integrated circuit comprises a processor; and
the second integrated circuit comprises a processor peripheral.

16. The electronic system of claim 14 wherein the first integrated circuit and the integrated interface circuit are disposed on a same die.

17. An electronic system, comprising:
a first integrated circuit having a first signal node and operable to provide a first logic signal on the first signal node;

a second integrated circuit having a second signal node and operable to provide a second logic signal on the second signal node; and an integrated interface circuit including
- a third node coupled to the first signal node,
- a fourth node coupled to the second signal node,
- a first translating circuit having a first signal path coupled between the third and fourth nodes, operable to sense a transition of the first logic signal on the third node, and operable in response to the transition to couple the first logic signal to the fourth node via the first signal path,
- a second translating circuit having a second signal path that is coupled between the third and fourth nodes, operable to sense a transition of the second logic signal on the fourth node, and operable in response to the transition of the second logic signal to couple the second logic signal to the third node via the second signal path;
- wherein the first translating circuit is operable in response to the transition of the first logic signal to disable the second translating circuit from coupling the second logic signal to the third node for a first predetermined time; and
- wherein the second translating circuit is operable in response to the transition of the second logic signal to disable the first translating circuit from coupling the first logic signal to the fourth node for a second predetermined time.

18. A method, comprising:
sensing a transition of a first logic signal on a first node;
coupling the first logic signal to a second node via a first signal path in response to the transition and in response to an enable signal;
sensing a transition of a second logic signal on the second node; and
coupling the second logic signal to the first node via a second signal path that is parallel to the first signal path in response to the transition of the second logic signal and in response to the enable signal.

19. The method of claim 18 wherein:
sensing the transition of the first logic signal comprises sensing the transition of the first logic signal from a first voltage level to a second voltage level;
coupling the first logic signal comprises translating the second voltage level to a third voltage level and coupling the third voltage level to the second node via the first signal path;
sensing the transition of the second logic signal comprises sensing the transition of the second logic signal from the first voltage level to the third voltage level; and
coupling the second logic signal comprises translating the third voltage level to the second voltage level and coupling the second voltage level to the first node via the second signal path.

20. The method of claim 18, further comprising:
prohibiting the coupling of the second logic signal to the first node for a predetermined time after sensing the transition of the first logic signal; and
prohibiting the coupling of the first logic signal to the second node for a predetermined time after sensing the transition of the second logic signal.

21. A method, comprising:
sensing a transition of a first logic signal on a first node;
coupling the first logic signal to a second node via a first signal path in response to the transition;
sensing a transition of a second logic signal on the second node;
coupling the second logic signal to the first node via a second signal path that is parallel to the first signal path in response to the transition of the second logic signal;
wherein coupling the first logic signal to the second node comprises driving the first logic signal onto the second node with a first drive strength during a first predetermined period and with a second drive strength after the elapse of the first predetermined period; and
wherein coupling the second logic signal to the first node comprises driving the second logic signal onto the first node with a third drive strength during a second predetermined period and with a fourth drive strength after the elapse of the second predetermined period.

22. A method, comprising:
sensing a transition of a first logic signal on a first node;
coupling the first logic signal to a second node via a first signal path in response to the transition;
sensing a transition of a second logic signal on the second node;
coupling the second logic signal to the first node via a second signal path that is parallel to the first signal path in response to the transition of the second logic signal;
wherein coupling the first logic signal to the second node comprises driving the first logic signal onto the second node with a first drive strength for a first predetermined time and with a second drive strength after the first predetermined time; and
wherein coupling the second logic signal to the first node comprises driving the second logic signal onto the first node with a third drive strength for a second predetermined time and with a fourth drive strength after the second predetermined time.

23. A method, comprising:
sensing a transition of a first logic signal on a first node;
coupling the first logic signal to a second node in response to the transition of the first logic signal;
sensing a transition of a second logic signal on a second node;
coupling the second logic signal to the first node in response to the transition of the second logic signal;
if the transition of the first logic signal is sensed before the transition of the second logic signal, then prohibiting the coupling of the second logic signal to the first node for a predetermined time after sensing the transition of the first logic signal; and
if the transition of the second logic signal is sensed before the transition of the first logic signal, then prohibiting the coupling of the first logic signal to the second node for a predetermined time after sensing the transition of the second logic signal.

24. The method of claim 23 wherein:
prohibiting the coupling of the second logic signal to the first node for a predetermined time after sensing the transition of the first logic signal comprises:
- prohibiting the coupling of a higher-strength version of the second logic signal to the first node for the predetermined time after sensing the transition of the first logic signal, and
- allowing the coupling of a lower-strength version of the second logic signal to the first node during the predetermined time after sensing the transition of the first logic signal; and prohibiting the coupling of the first logic signal to the second node for a predetermined time after sensing the transition of the second logic signal comprises:

prohibiting the coupling of a higher-strength version of the first logic signal to the second node for the predetermined time after sensing the transition of the second logic signal, and allowing the coupling of a lower-strength version of the first logic signal to the second node during the predetermined time after sensing the transition of the second logic signal.

25. The method of claim 23 wherein:

prohibiting the coupling of the second logic signal to the first node for a predetermined time after sensing the transition of the first logic signal comprises prohibiting the coupling of a higher-strength version of the second logic signal to the first node for the predetermined time after sensing the transition of the first logic signal; and prohibiting the coupling of the first logic signal to the second node for a predetermined time after sensing the transition of the second logic signal comprises prohibiting the coupling of a higher-strength version of the first logic signal to the second node for the predetermined time after sensing the transition of the second logic signal.

26. A bidirectional signal interface, comprising:

a first node operable to receive a first logic signal having a first voltage level;

a second node operable to receive a second logic signal having a second voltage level that is different from the first voltage level;

a third node operable to receive a third logic signal having a third voltage level that is different from the first and second voltage levels; and translating circuitry coupled to the first, second, and third nodes and operable to couple the first logic signal from the first node to the second node by translating the first voltage level to the second voltage level, couple the first logic signal from the first node to the third node by translating the first voltage level to the third voltage level, couple the second logic signal from the second node to the first node by translating the second voltage level to the first voltage level, and couple the third logic signal from the third node to the first node by translating the third voltage level to the first voltage level.

27. The bidirectional signal interface of claim 26 wherein:

the first node is operable to receive the first logic signal having a fourth voltage level that is different from the first, second, and third voltage levels;

the second node is operable to receive the second logic signal having the fourth voltage level;

the third node is operable to receive the third logic signal having the fourth voltage level; and the translating circuitry is operable to couple the first logic signal having the fourth voltage level from the first node to the second node, couple the first logic signal having the fourth voltage level from the first node to the third node, couple the second logic signal having the fourth voltage from the second node to the first node, and couple the third logic signal having the fourth voltage from the third node to the first node.

28. The bidirectional signal interface of claim 26 wherein the translating circuitry is operable to receive first, second, and third supply voltages, each supply voltage substantially and respectively equal to the first, second, and third voltage levels.

29. The bidirectional signal interface of claim 26, further comprising:

a fourth node operable to receive a fourth logic signal having a fourth voltage level that is different from the first, second, and third voltage levels; and wherein the translating circuitry is coupled to the fourth node and is operable to couple the fourth logic signal from the fourth node to the second node by translating the fourth voltage level to the second voltage level, couple the fourth logic signal from the fourth node to the third node by translating the fourth voltage level to the third voltage level, couple the second logic signal from the second node to the fourth node by translating the second voltage level to the fourth voltage level, and couple the third logic signal from the third node to the fourth node by translating the third voltage level to the fourth voltage level.

30. The bidirectional signal interface of claim 26 wherein:

the first voltage level is greater than the second voltage level; and the second voltage level is greater than the third voltage level.

31. The bidirectional signal interface of claim 26 wherein:

the first voltage level is greater than the third voltage level; and the third voltage level is greater than the second voltage level.

32. The bidirectional signal interface of claim 26 wherein:

the second voltage level is greater than the first voltage level; and the first voltage level is greater than the third voltage level.

33. The bidirectional signal interface of claim 26 wherein:

the second voltage level is greater than the third voltage level; and the third voltage level is greater than the first voltage level.

34. The bidirectional signal interface of claim 26 wherein:

the third voltage level is greater than the first voltage level; and the first voltage level is greater than the second voltage level.

35. The bidirectional signal interface of claim 26, wherein:

the third voltage level is greater than the second voltage level; and the second voltage level is greater than the first voltage level.

36. An electronic system, comprising:

a first integrated circuit having a first signal node and operable to provide on the first signal node a first logic signal having a first voltage level;

a second integrated circuit having a second signal node and operable to provide on the second signal node a second logic signal having a second voltage level that is different from the first voltage level;

a third integrated circuit having a third signal node and operable to provide on the third signal node a third logic signal having a third voltage level that is different from the first and second voltage levels; and an integrated interface circuit including a fourth node coupled to the first signal node, a fifth node coupled to the second signal node, a sixth node coupled to the third signal node, and translating circuitry coupled to the fourth, fifth, and sixth nodes and operable to couple the first logic signal from the fourth node to the fifth node by translating the first voltage level to the second voltage level, couple the first logic signal from the fourth node to the sixth node by translating the first voltage level to the third voltage level, couple the second logic signal from the fifth node to the fourth node by translating the second voltage level to the first voltage level, and couple the third logic signal from the sixth node to the fourth node by translating the third voltage level to the first voltage level.

37. The electronic system of claim 36 wherein the first, second, and third integrated circuits and the integrated interface circuit are disposed on a same die.

38. A method, comprising:

translating a first voltage level of a first logic signal on a first node to a second voltage level on a second node, the second voltage level being different than the first voltage level; and translating the first voltage level of the first logic signal on the first node to a third voltage level on a third node, the third voltage level being different than the first and second voltage levels.

39. The method of claim 38, further comprising:

translating the second voltage level of a second logic signal on the second node to the first voltage level on the first node.

40. The method of claim 38, further comprising:

translating the second voltage level of a second logic signal on the second node to the first voltage level on the first node; and translating the third voltage level of a third logic signal on the third node to the first voltage level on the first node.

41. The method of claim 38, further comprising translating a fourth voltage level of a second logic signal on a fourth node to the second voltage level on the second node, the fourth voltage level being different than the first, second, and third voltage levels.

42. The method of claim 38, further comprising:

translating a fourth voltage level of a second logic signal on a fourth node to the second voltage level on the second node, the fourth voltage level being different than the first, second, and third voltage levels; and translating the second voltage level of a third logic signal on the second node to the fourth voltage level on the fourth node.

43. The method of claim 38, further comprising:

translating a fourth voltage level of a second logic signal on a fourth node to the second voltage level on the second node, the fourth voltage level being different than the first, second, and third voltage levels; and translating the fourth voltage level of the second logic signal on the fourth node to the third voltage level on the third node.

44. The method of claim 38, further comprising:

translating a fourth voltage level of a second logic signal on a fourth node to the second voltage level on the second node, the fourth voltage level being different than the first, second, and third voltage levels;

translating the fourth voltage level of the second logic signal on the fourth node to the third voltage level on the third node;

translating the second voltage level of a third logic signal on the second node to the fourth voltage level on the fourth node; and translating the third voltage level of a fourth logic signal on the third node to the fourth voltage level on the fourth node.

45. The method of claim 38 wherein:

the first voltage level is less than the second voltage level; and the second voltage level is less than the third voltage level.

46. The method of claim 38 wherein:

the first voltage level is less than the third voltage level; and the third voltage level is less than the second voltage level.

47. The method of claim 38 wherein:

the second voltage level is less than the first voltage level; and the first voltage level is less than the third voltage level.

48. The method of claim 38 wherein:

the second voltage level is less than the third voltage level; and the third voltage level is less than the first voltage level.

49. The method of claim 38 wherein:

the third voltage level is less than the first voltage level; and the first voltage level is less than the second voltage level.

50. The method of claim 38, wherein:

the third voltage level is less than the second voltage level; and the second voltage level is less than the first voltage level.

51. A method, comprising:

sensing a transition of a first logic signal on a first node;

generating a disable signal in response to the sensed transition, the disable signal having a duration that is at least sufficient to allow the first logic signal to propagate from the first node to a second node; and prohibiting the coupling of a second logic signal from the second node to the first node in response to the disable signal.

52. The method of claim 51, further comprising:

sensing a transition of third second logic signal on the second node; and prohibiting the coupling of a fourth logic signal from the first node to the second node for at least a predetermined time after sensing the transition of the third logic signal.

53. The method of claim 51 wherein prohibiting the coupling of a second logic signal from a second node to the first node comprises prohibiting the coupling of a higher-strength version of the second logic signal from the second node to the first node in response to the disable signal.

54. The method of claim 51 wherein prohibiting the coupling of a second logic signal from a second node to the first node comprises:

prohibiting the coupling of a higher-strength version of the second logic signal from the second node to the first node in response to the disable signal; and allowing the coupling of a lower-strength version of the second logic signal from the second node to the first node during the duration of the disable signal.

* * * * *